US010192599B2

(12) United States Patent
Kwon et al.

(10) Patent No.: US 10,192,599 B2
(45) Date of Patent: Jan. 29, 2019

(54) SEMICONDUCTOR DEVICE

(71) Applicant: SK hynix Inc., Icheon-si Gyeonggi-do (KR)

(72) Inventors: Ki Hun Kwon, Yongin-si (KR); Jae Il Kim, Yongin-si (KR)

(73) Assignee: SK hynix Inc., Incheon-si, Gyeonggi-do (KR)

( * ) Notice: Subject to any disclaimer, the term of this patent is extended or adjusted under 35 U.S.C. 154(b) by 0 days.

(21) Appl. No.: 15/667,290

(22) Filed: Aug. 2, 2017

(65) Prior Publication Data

US 2018/0166112 A1 Jun. 14, 2018

(30) Foreign Application Priority Data

Dec. 8, 2016 (KR) ........................ 10-2016-0166975

(51) Int. Cl.

| | |
|---|---|
| ***G11C 8/18*** | (2006.01) |
| ***G11C 8/10*** | (2006.01) |
| ***G11C 7/22*** | (2006.01) |
| ***G11C 7/10*** | (2006.01) |
| ***G11C 11/4076*** | (2006.01) |
| ***G11C 11/4093*** | (2006.01) |

(52) U.S. Cl.

CPC .................. *G11C 8/18* (2013.01); *G11C 7/10* (2013.01); *G11C 7/1051* (2013.01); *G11C 7/1078* (2013.01); *G11C 7/22* (2013.01); *G11C 8/10* (2013.01); *G11C 11/4076* (2013.01); *G11C 11/4093* (2013.01)

(58) Field of Classification Search

CPC .................................... G11C 8/18; G11C 7/22

USPC ........................................... 365/233.1, 233.5

See application file for complete search history.

(56) References Cited

U.S. PATENT DOCUMENTS

| | | | | |
|---|---|---|---|---|
| 5,666,322 | A * | 9/1997 | Conkle ................ | G11C 7/1042 327/147 |
| 9,123,406 | B2 | 9/2015 | Lee et al. | |
| 2006/0044032 | A1* | 3/2006 | Gomm ................ | G11C 7/1066 327/157 |
| 2007/0183249 | A1* | 8/2007 | Yang .................... | G11C 7/1078 365/233.14 |
| 2015/0340072 | A1* | 11/2015 | Mazumder ............. | G11C 7/222 365/189.05 |
| 2016/0134285 | A1* | 5/2016 | Ha ..................... | H03K 19/0005 326/30 |

* cited by examiner

*Primary Examiner* — Michael Tran

(74) *Attorney, Agent, or Firm* — William Park & Associates Ltd.

(57) ABSTRACT

A semiconductor device may be provided. The semiconductor device may operate in a 2N mode as well as a normal mode.

19 Claims, 16 Drawing Sheets

10a

SEMICONDUCTOR DEVICE

CROSS-REFERENCES TO RELATED APPLICATION

The present application claims priority under 35 U.S.C. § 119(a) to Korean application number 10-2016-0166975, filed on Dec. 8, 2016, in the Korean Intellectual Property Office, which is incorporated herein by reference in its entirety.

BACKGROUND

1. Technical Field

Various embodiments may generally relate to a semiconductor device, and more particularly, to a semiconductor device relating to a 2N mode.

2. Related Art

A semiconductor device such as DRAM transmits and receives information to and from an external device, using a clock. That is, the external device transmits information with the clock, and the semiconductor device recognizes information transmitted at a rising edge and/or falling edge of the clock as a valid value.

The recent trend is to increase the frequency of a clock, in order to increase the transmission rate of data. However, the increase in frequency of the clock decreases a setup and hold (setup/hold) margin of information, thereby increasing the possibility that an error will occur when the information is transmitted.

In order to secure a setup/hold margin, the frequency of an external clock may be lowered to half. This mode is referred to as a 2N mode. That is, in the 2N mode, information is inputted at each two cycles of the external clock.

In order for an existing semiconductor device to operate in the 2N mode, many components of the semiconductor device need to be changed.

SUMMARY

In an embodiment of the present disclosure, a semiconductor device may be provided. In an embodiment, a semiconductor device may operate in a 2N mode as well as a normal mode. A semiconductor device may include an internal clock generation circuit configured to generate a first internal clock having a cycle corresponding to double a cycle of an external clock and a second internal clock having a substantially opposite phase to a phase of the first internal clock, based on the cycle of the external clock. A semiconductor device may include a control signal receiver circuit configured to sequentially receive first and second control signals and may generate first and second internal control signals, based on the first and second internal clocks. A semiconductor device may include an ODT command generation circuit configured to generate an ODT control signal based on results obtained by decoding the first and second internal control signals. A semiconductor device may include an internal command generation circuit configured to generate first and second internal commands based on the ODT control signal and the decoding results of the first and second internal control signals.

DETAILED DESCRIPTION

Figure 1:
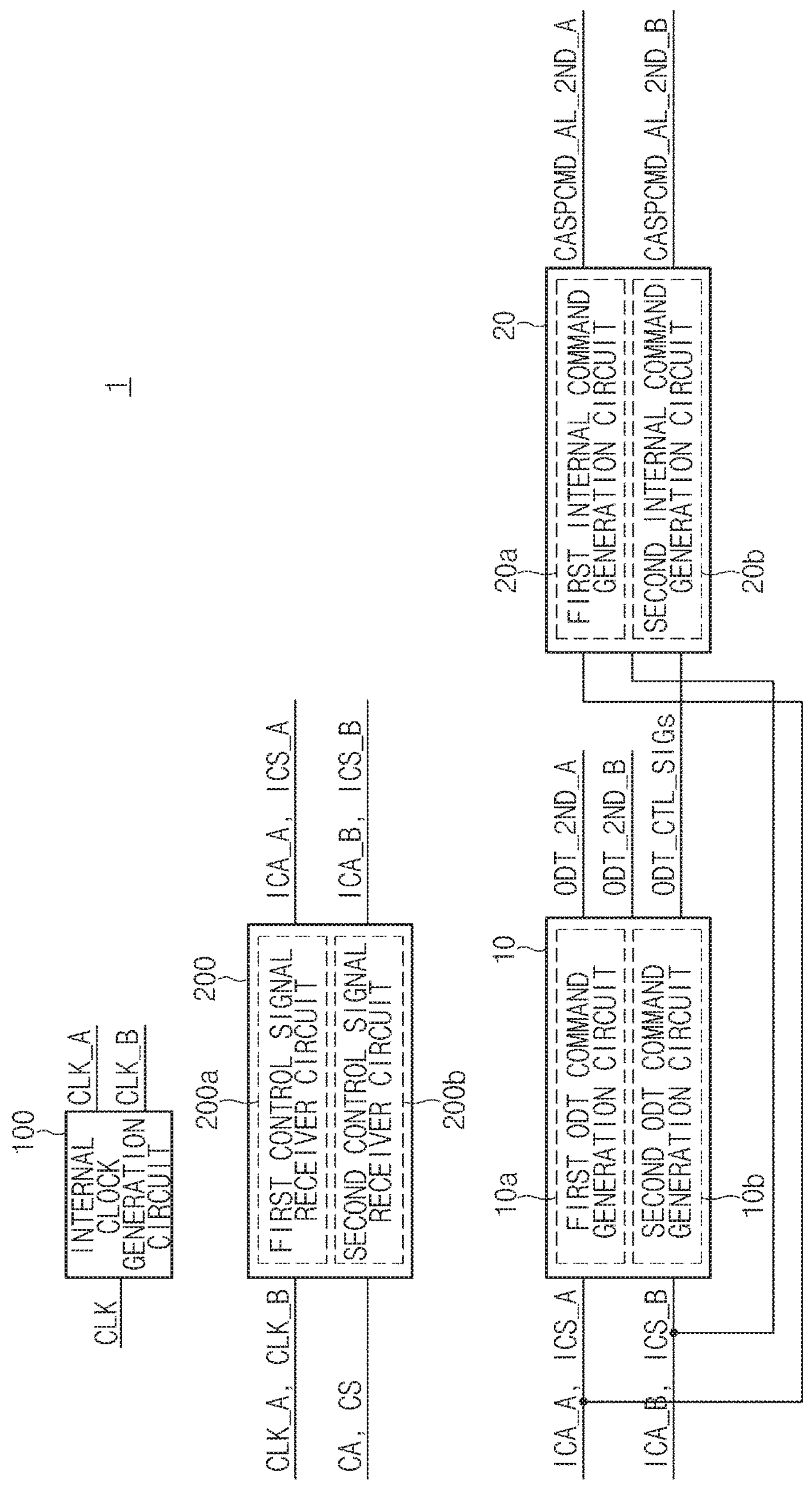
FIG. 1 is a schematic configuration diagram of a semiconductor device according to an embodiment.

Hereinafter, a semiconductor device according to the present disclosure will be described below with reference to the accompanying drawings through examples of embodiments.

For reference, an embodiment including additional components may be provided. Furthermore, a high level or low level signal configuration indicating an enabled state or disabled state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Various embodiments may be directed to a semiconductor device capable of operating in the 2N mode, thereby stably transmitting information.

A semiconductor device 1 transmits and receives (transmits/receives) information to and from (to/from) an external device (not illustrated) through a predetermined number of pins. Since the semiconductor device 1 has a limited area, the number of pins is limited. Therefore, the semiconductor device 1 may generate a large number of internal commands by decoding control signals such as a command and address (command/address) signal CA and chip select signal CS inputted through the predetermined number of pins.

In addition, the semiconductor device 1 may receive control signals from the external device during two cycles, in order to generate a larger number of internal commands. For example, as a control signal corresponding to a write command for a specific memory cell, the semiconductor device 1 may receive a command/address signal CA having a specific value with a high-level chip select signal CS during the first cycle, and receive the command/address signal CA having a specific value with a low-level chip select signal CS during the second cycle. In this specification, the control signals which are transmitted from the external device during two cycles in order to control the semiconductor device 1 to perform an operation corresponding to an internal command may be referred to a two-cycle command. Furthermore, between the control signals serving as the two-cycle command, a control signal corresponding to the first cycle is referred to as a first control signal, and a control signal corresponding to the second cycle is referred to as a second control signal. In a present embodiment, a control signal may indicate a two-cycle command including the first and second control signals which are successively inputted, and contain the command/address signal CA and the chip select signal CS.

The semiconductor device 1 according to a present embodiment generates internal commands by decoding control signals which are a two-cycle command. In particular, the semiconductor device 1 supports both a normal mode and a 2N mode. In the normal mode, the semiconductor device 1 processes first and second control signals which are consecutively transmitted during the same cycle as the cycle of an external clock. In the 2N mode, the semiconductor device 1 processes first and second control signals which are consecutively transmitted during double the cycle of the external clock. At this time, whether the semiconductor device 1 operates in the normal mode or the 2N mode may be determined in advance, according to information between the semiconductor device 1 and an external device (not illustrated) for transmitting a control signal to the semiconductor device 1, for example, a memory control circuit. The operation mode may be determined by setting the value of a mode register for storing settings of the semiconductor device 1.

A present embodiment is based on the supposition that an ODT command generated by an ODT command generation circuit 10 is generated when the chip select signal CS of the second control signal is at a high level, and an internal command generated by an internal command generation circuit 20 is generated when the chip select signal CS of the second control signal is at a low level. That is, the ODT command generated by the ODT command generation circuit and the internal command generated by the internal command generation circuit 20 are distinguished by the level of the chip select signal CS of the second control signal.

In a present embodiment, however, the ODT command is an example of an internal command which is distinguished from the internal command generated by the internal command generation circuit 20. Thus, when the chip select signal CS of the second control signal corresponding to the internal command generated by the ODT command generation circuit 10 is different from the chip select signal CS of the second control signal corresponding to the internal command generated by the internal command generation circuit 20, the internal command generated by the ODT command generation circuit 10 may not be an ODT command, but another internal command.

Hereafter, referring to FIG. 1, the operation of the semiconductor device 1 will be described. In FIG. 1 for describing the operation of the semiconductor device 1, some signals are omitted.

FIG. 1 is a configuration diagram of the semiconductor device 1 according to a present embodiment.

Referring to FIG. 1, the semiconductor device 1 includes an internal clock generation circuit 100, a control signal receiver circuit 200, the ODT command generation circuit 10 and the internal command generation circuit 20.

The internal clock generation circuit 100 divides an external clock by two, and generates a first internal clock CLK_A corresponding to an odd-numbered cycle and a second internal clock CLK_B corresponding to an even-numbered cycle. Since the first and second internal clocks CLK_A and CLK_B are generated by dividing the external clock CLK by two, the cycle of the first and second internal clocks CLK_A and CLK_B corresponds to the double cycle of the external clock CLK. The first and second internal clocks CLK_A and CLK_B have the same frequency as each other, and have a phase difference of 180 degrees from each other. In an embodiment, for example, the internal clock generation circuit may be configured to generate a first internal clock CLK_A having a cycle corresponding to double a cycle of an external clock CLK and a second internal clock CLK_B having a substantially opposite phase to a phase of the first internal clock CLK_A, based on the cycle of the external clock CLK.

The control signal receiver circuit 200 generates an internal control signal ICA_A and ICS_A or ICA_B and ICS_B by receiving the control signal CA and CS in synchronization with the first or second internal clock CLK_A or CLK_B. The control signal receiver circuit 200 may include a first control signal receiver circuit 200*a* and a second control signal receiver circuit 200*b*.

The first control signal receiver circuit 200*a* generates a first internal control signal (first internal command/address signal ICA_A and first internal chip select signal ICS_A) by receiving the control signal CA and CS in synchronization with the first internal clock CLK_A. The second control signal receiver circuit 200*b* generates a second internal control signal (second internal command/address signal ICA_B and second internal chip select signal ICS_B) by receiving the control signal CA and CS in synchronization with the second internal clock CLK_B.

Thus, in the normal mode, the control signal receiver circuit 200 may generate the first internal control signal ICA_A and ICS_A by receiving the first control signal in synchronization with the first internal clock CLK_A, and generate the second internal control signal ICA_B and ICS_B by receiving the second control signal in synchronization with the second internal clock CLK_B. In the 2N mode, the control signal receiver circuit 200 may generate the first internal control signal ICA_A and ICS_A corresponding to the first control signal and the first internal control signal ICA_A and ICS_A corresponding to the second control signal at successive rising edges of the first internal clock CLK_A, or generate the second internal control signal ICA_B and ICS_B corresponding to the first control signal and the second internal control signal ICA_B and ICS_B corresponding to the second control signal at successive rising edges of the second internal clock CLK_B.

The ODT command generation circuit 10 generates an ODT command ODT_2ND_A or ODT_2ND_B and ODT control signals ODT_CTL_SIGs for controlling the internal command generation circuit 20, based on the internal control signal ICA_A and ICS_A or ICA_B and ICS_B. Since the ODT control signals ODT_CTL_SIGs indicate a plurality of signals which will be described later, the ODT control signals ODT_CTL_SIGs will be described later.

The ODT command generation circuit 10 may include a first ODT command generation circuit 10*a* and a second ODT command generation circuit 10*b*. The first ODT command generation circuit 10*a* generates a first ODT command ODT_2ND_A and a part of the ODT control signals ODT_CTL_SIGs, based on the first internal control signal ICA_A and ICS_A synchronized with the first internal clock CLK_A. The second ODT command generation circuit 10*b* generates a second ODT command ODT_2ND_A and the other part of the ODT control signals ODT_CTL_SIGs, based on the second internal control signal ICA_B and ICS_B synchronized with the second internal clock CLK_B.

The internal command generation circuit 20 generates the internal command CASPCMD_AL_2ND_A or CASPCMD_AL_2ND_B, based on the internal control signal ICA_A and ICS_A or ICA_B and ICS_B and the ODT control signals ODT_CTL_SIGs. The internal command generation circuit 20 may include a first internal command generation circuit 20*a* and a second internal command generation circuit 20*b*. The first internal command generation circuit 20*a* generates the first internal command CASPCMD_AL_2ND_B, based on the ODT control signals ODT_CTL_SIGs and the first internal control signal ICA_A and ICS_A synchronized with the first internal clock CLK_A. The second internal command generation circuit 20*b* generates the second internal command CASPCMD_AL_2ND_A, based on the ODT control signals ODT_CTL_SIGs and the second internal control signal ICA_B and ICS_B synchronized with the second internal clock CLK_B.

Hereafter, the operations of the respective circuits of the semiconductor device 1 will be described in order of an ODT command generation operation in the normal mode, an ODT command generation operation in the 2N mode, an internal command generation operation in the normal mode, and an internal command generation operation in the 2N mode.

<ODT Command Generation Operation in Normal Mode>

In the normal mode, the control signal receiver circuit 200 generates the first internal control signal ICA_A and ICS_A by receiving the first control signal in synchronization with the first internal clock CLK_A, and generates the second internal control signal ICA_B and ICS_B by receiving the second control signal in synchronization with the second internal clock CLK_B. Thus, the first and second ODT command generation circuits 10*a* and 10*b* generate the ODT commands (first and second ODT commands ODT_2ND_A and ODT_2ND_B) and the ODT control signals ODT_CTL_ SIGs, based on the first internal control signal ICA_A and ICS_A and the second internal control signal ICA_B and ICS_B.

The semiconductor device 1 performs a predetermined operation corresponding to the pair of first and second ODT commands ODT_2ND_A and ODT_2ND_B, that is, an ODT operation.

<ODT Command Generation Operation in 2N Mode>

In the 2N mode, the first and second control signals are inputted at successive rising edges of the first internal clock CLK_A or successive rising edges of the second internal clock CLK_B. When the first and second control signals are inputted in synchronization with the first internal clock CLK_A, the first control signal receiver circuit 200*a* generates the first internal control signal ICA_A and ICS_A corresponding to the first control signal and the first internal control signal ICA_A and ICS_A corresponding to the second control signal.

The first ODT command generation circuit 10*a* generates the ODT control signals ODT_CTL_SIGs and the pair of the first ODT command ODT_2ND_A corresponding to the first control signal and the first ODT command ODT_2ND_A corresponding to the second control signal, based on the first internal control signal ICA_A and ICS_A corresponding to the first control signal and the first internal control signal ICA_A and ICS_A corresponding to the second control signal.

At this time, the first ODT command ODT_2ND_A generated on the basis of the first control signal and the first ODT command ODT_2ND_A generated on the basis of the second control signal are represented by the same symbol. However, since the first and second control signals are inputted at different timings, the first ODT command ODT_2ND_A generated on the basis of the first control signal may be different from the first ODT command ODT_2ND_A generated on the basis of the second control signal.

The semiconductor device 1 performs an ODT operation using the pair of first ODT commands ODT_2ND_A which includes the first ODT command ODT_2ND_A generated by decoding the first control signal and the first ODT command ODT_2ND_A generated by decoding the second control signal.

When the first and second control signals are inputted in synchronization with the second internal clock CLK_B, the second ODT command generation circuit 10*b* performs the same operation as the first ODT command generation circuit 10*a*. That is, the second ODT command generation circuit 10*b* generates the second ODT command ODT_2ND_B by decoding the first control signal, and generates the second ODT command ODT_2ND_B by decoding the second control signal. The semiconductor device 1 performs a preset operation using the pair of second ODT commands ODT_2ND_B which includes the second ODT command ODT_2ND_B generated by decoding the first control signal and the second ODT command ODT_2ND_B generated by decoding the second control signal.

<Internal Command Generation Operation in Normal Mode>

In the normal mode, the external device transmits the first and second control signals in a cycle of the external clock CLK. The first control signal receiver circuit 200*a* generates the first internal control signal ICA_A and ICS_A by receiving the first control signal in synchronization with the first internal clock CLK_A, and the second control signal receiver circuit 200*b* generates the second internal control signal ICA_B and ICS_B by receiving the second control signal in synchronization with the second internal clock CLK_B.

Thus, the first internal command generation circuit 20*a* generates the first internal command CASPCMD_AL_2ND_B, based on the first internal control signal ICA_A and ICS_A and the ODT control signals ODT_CTL_SIGs. The second internal command generation circuit 20*b* generates the second internal command CASPCMD_AL_2ND_A, based on the second internal control signal ICA_B and ICS_B and the ODT control signals ODT_CTL_SIGs.

The semiconductor device 1 performs a specific operation corresponding to the pair of first and second internal commands CASPCMD_AL_2ND_A and CASPCMD_AL_2ND_B.

<Internal Command Generation Operation in 2N Mode>

In the 2N mode, the external device transmits the first and second control signals in the double cycle of the external clock CLK. Thus, the first control signal receiver circuit 200*a* may generate the first internal control signal ICA_A and ICS_A corresponding to the first control signal and the first internal control signal ICA_A and ICS_A corresponding to the second control signal.

In this case, the first internal command generation circuit 20*a* may generate the first internal command CASPCMD_AL_2ND_B, based on the ODT control signals ODT_CTL_SIGs and the first internal control signal ICA_A and ICS_A corresponding to the first control signal. Furthermore, the first internal command generation circuit 20*a* may generate the first internal command CASPCMD_AL_2ND_B, based on the ODT control signals ODT_CTL_SIGs and the first internal control signal ICA_A and ICS_A corresponding to the second control signal.

Alternatively, the first control signal receiver circuit 200*b* may generate the second internal control signal ICA_B and ICS_B corresponding to the first control signal and the second internal control signal ICA_B and ICS_B corresponding to the second control signal. In this case, the second internal command generation circuit 20*b* may generate the second internal command CASPCMD_AL_2ND_A, based on the ODT control signals ODT_CTL_SIGs and the second internal control signal ICA_B and ICS_B corresponding to the first control signal. Furthermore, the second internal command generation circuit 20*b* may generate the second internal command CASPCMD_AL_2ND_A, based on the ODT control signals ODT_CTL_SIGs and the second internal control signal ICA_B and ICS_B corresponding to the second control signal.

At this time, whether to operate the first or second internal command generation circuit 20*a* or 20*b* in the 2N mode may be determined according to the input timing of the first or second control signal. Alternatively, only any one of the first and second internal command generation circuits 20*a* and 20*b* may be operated in the 2N mode, according to a preset condition.

At this time, the first control signal (command/address CA and chip select signal CS) and the second control signal (command/address CA and chip select signal CS) are represented by the same symbol, but inputted at different timings. Thus, the first control signal and the second control signal may have different values. Furthermore, the first internal command CASPCMD_AL_2ND_B generated by the first internal command generation circuit 20*a* in response to the first control signal and the first internal command CASPCMD_AL_2ND_B generated by the first internal command generation circuit 20*a* in response to the second control signal are represented by the same symbol, but generated at different timings. Thus, the first internal commands CASPCMD_AL_2ND_A may have different values. Furthermore, the second internal command CASPCMD_AL_2ND_A generated by the second internal command generation circuit 20*b* in response to the first control signal and the second internal command CASPCMD_AL_2ND_A generated by the second internal command generation circuit 20*b* in response to the second control signal are represented by the same symbol, but generated at different timings. Thus, the second internal commands CASPCMD_AL_2ND_B may have different values.

The semiconductor device 1 may perform a specific operation in response to the pair of first internal commands CASPCMD_AL_2ND_A which correspond to the first and second control signals, respectively, and are generated by the first internal command generation circuit 20*a*. Alternatively, the semiconductor device 1 may perform a specific operation in response to the pair of second internal commands CASPCMD_AL_2ND_B which correspond to the first and second control signals, respectively, and are generated by the second internal command generation circuit 20*b*.

In this case, since the semiconductor device 1 receives the first and second control signals in synchronization with the first or second internal clock CLK_A or CLK_B, the semiconductor device 1 is operated in a cycle corresponding to the double cycle of the external clock CLK.

When the internal commands are generated, both of the first and second internal command generation circuits 20*a* and 20*b* are used in the normal mode, and only the first or second internal command generation circuit 20*a* or 20*b* is used in the 2N mode.

Next, referring to FIGS. 2 to 6, the configurations of the respective circuits of the semiconductor device 1 will be described.

Figure 2A:
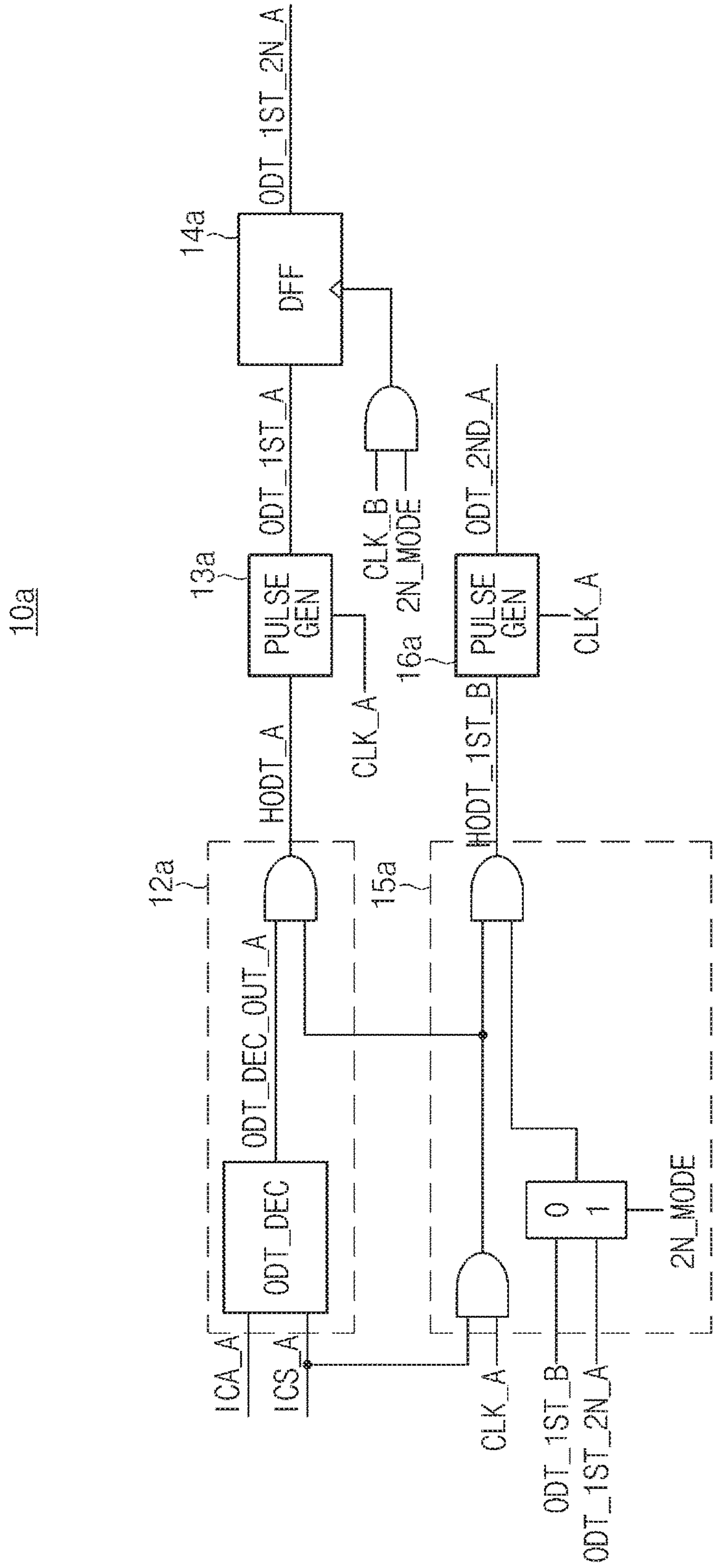
FIG. 2A is a circuit diagram of a first on die termination (ODT) command generation circuit of FIG. 1.
Figure 2B:
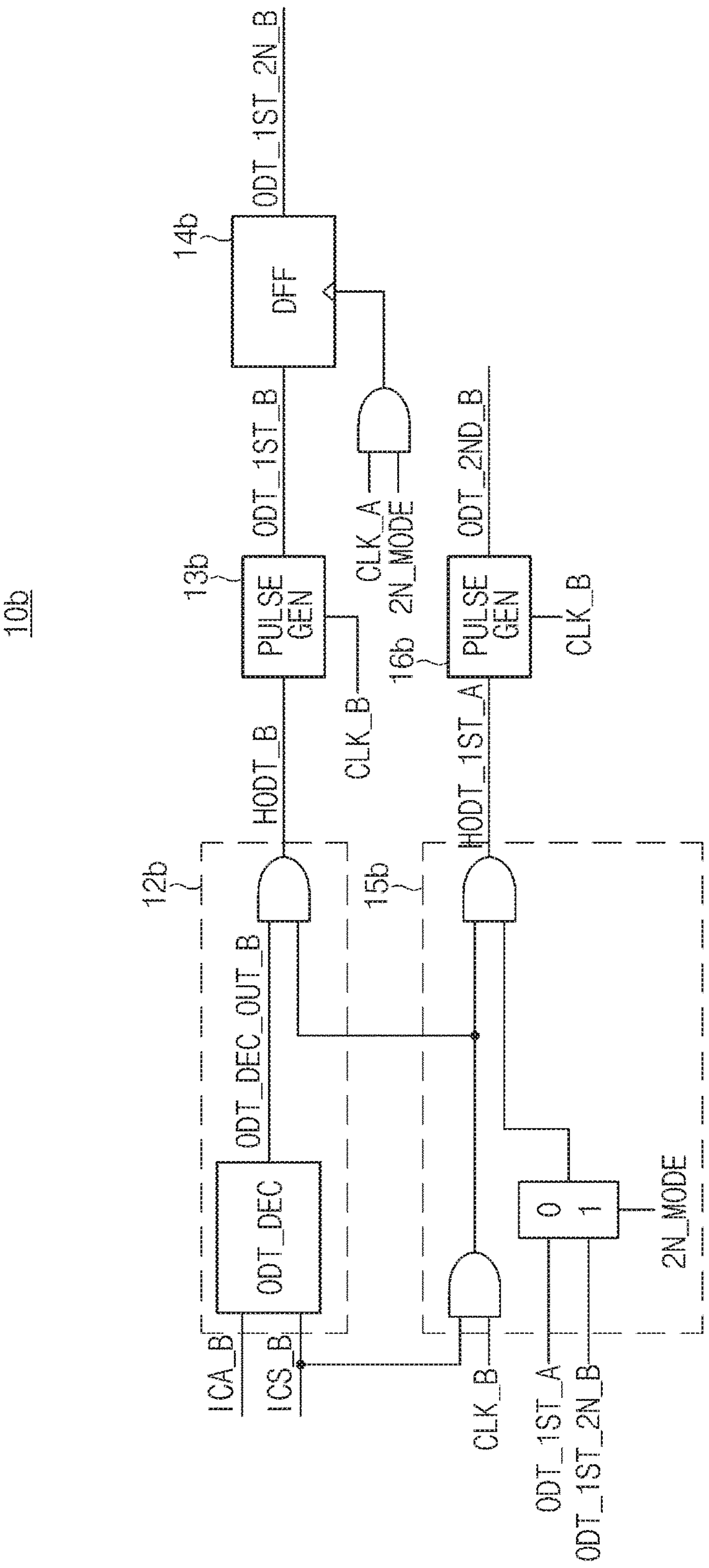
FIG. 2B is a circuit diagram of a second ODT command generation circuit of FIG. 1.

FIG. 2A is a circuit diagram of the first ODT command generation circuit 10*a* of FIG. 1, and FIG. 2B is a circuit diagram of the second ODT command generation circuit 10*b* of FIG. 1.

Referring to FIG. 2A, the first ODT command generation circuit 10*a* includes a first ODT signal generation circuit 12*a*, a pulse width adjusting circuit 13*a*, a D flip-flop 14A, a first ODT chip select signal control circuit 15*a* and a pulse width adjusting circuit 16*a*.

The first ODT signal generation circuit 12*a* generates a first ODT decoding signal HODT_A by decoding the first internal control signal (first internal command/address signal ICA_A and first internal chip select signal ICS_A). In a present embodiment, when a value obtained by decoding the first internal command/address signal ICA_A corresponds to a preset value and the first internal chip select signal ICS_A is at a high level, the first ODT signal generation circuit 12*a* may enable the first ODT decoding signal HODT_A.

The pulse width adjusting circuit 13*a* generates a first pulse width adjusted ODT signal ODT_1ST_A by adjusting the pulse width of the first ODT decoding signal HODT_A to the cycle of the first internal clock CLK_A.

The D flip-flop 14*a* generates a first 2N mode ODT signal ODT_1ST_2N_A by synchronizing the first pulse width adjusted ODT signal ODT_1ST_A with the second internal clock CLK_B in the 2N mode.

When a 2N mode signal 2N_MODE is disabled (normal mode), the first ODT chip select signal control circuit 15*a* generates a first CS controlled ODT signal HODT_1ST_B based on a second pulse width adjusted ODT signal ODT_1ST_B. Furthermore, when the 2N mode signal 2N_MODE is enabled (2N mode), the first ODT chip select signal control circuit 15*a* generates the first CS controlled ODT signal HODT_1ST_B based on the first 2N mode ODT signal ODT_1ST_2N_A. As illustrated in FIG. 2A, the first ODT chip select signal control circuit 15*a* may include an AND operator for performing an AND operation on the first internal clock CLK_A and the first internal chip select signal ICS_A, a multiplexer for outputting the second pulse width adjusted ODT signal ODT_1ST_B or the first 2N mode ODT signal ODT_1ST_2N_A based on the 2N mode signal 2N_MODE, and an AND operator for generating the first CS controlled ODT signal HODT_1ST_B by performing an AND operation on the outputs of the AND operator and the multiplexer.

The pulse width adjusting circuit 16*a* generates the first ODT command ODT_2ND_A by adjusting the pulse width of the first CS controlled ODT signal HODT_1ST_B to the cycle of the first internal clock CLK_A.

Next, referring to FIG. 2B, the second ODT command generation circuit 10*b* includes a second ODT signal generation circuit 12*b*, a pulse width adjusting circuit 13*b*, a D flip-flop 14*b*, a second ODT chip select signal control circuit 15*b* and a pulse width adjusting circuit 16*b*, substantially similar to the first ODT command generation circuit 10*a*.

The second ODT signal generation circuit 12*b* generates a second ODT decoding signal HODT_B by decoding the second internal control signal (second internal command/address signal ICA_B and second internal chip select signal ICS_B). In a present embodiment, when a value obtained by decoding the second internal command/address signal ICA_B corresponds to a preset value and the second internal chip select signal ICS_B is at a high level, the second ODT signal generation circuit 12*b* may enable the second ODT decoding signal HODT_B.

The pulse width adjusting circuit 13*b* generates the second pulse width adjusted ODT signal ODT_1ST_B by adjusting the pulse width of the second ODT decoding signal HODT_B to the cycle of the second internal clock CLK_B.

The D flip-flop 14*b* generates a second 2N mode ODT signal ODT_1ST_2N_B by synchronizing the second pulse width adjusted ODT signal ODT_1ST_B with the first internal clock CLK_A in the 2N mode.

When the 2N mode signal 2N_MODE is disabled (normal mode), the second ODT chip select signal control circuit 15*b* generates the second CS controlled ODT signal HODT_1ST_A based on the first pulse width adjusted ODT signal ODT_1ST_A. Furthermore, when the 2N mode signal 2N_MODE is enabled (2N mode), the second ODT chip select signal control circuit 15*b* generates the second CS controlled ODT signal HODT_1ST_A based on the second 2N mode ODT signal ODT_1ST_2N_B. As illustrated in FIG. 2B, the second ODT chip select signal control circuit 15*b* may include an AND operator for performing an AND operation on the second internal clock CLK_B and the second internal chip select signal ICS_B, a multiplexer for outputting the first pulse width adjusted ODT signal ODT_1ST_A or the second 2N mode ODT signal ODT_1ST_2N_B based on the 2N mode signal 2N_MODE, and an AND operator for generating the second CS controlled ODT signal HODT_1ST_A by performing an AND operation on the outputs of the AND operator and the multiplexer.

The pulse width adjusting circuit 16*b* generates the second ODT command ODT_2ND_B by adjusting the pulse width of the second CS controlled ODT signal HODT_1ST_A to the cycle of the first internal clock CLK_B.

The operations of the first and second ODT command generation circuits 10*a* and 10*b* are performed as follows.

First, the operations of the first and second ODT command generation circuits 10*a* and 10*b* in the normal mode are performed as follows.

In the normal mode, the first and second control signals corresponding to the ODT command (that is, a set of the first and second ODT commands ODT_2ND_A and ODT_2ND_B) are sequentially inputted from the external device (not illustrated) in a cycle of the external clock CLK. Thus, the first control signal receiver circuit 200*a* generates the first internal control signal ICA_A and ICS_A by synchronizing the first control signal with the first internal clock CLK_A, and the second control signal receiver circuit 200*b* generates the second internal control signal ICA_B and ICS_B by synchronizing the second control signal with the second internal clock CLK_B. The first internal control signal ICA_A and ICS_A is inputted to the first ODT command generation circuit 10*a*, and the second internal control signal ICA_B and ICS_B is inputted to the second ODT command generation circuit 10*b*.

When the value obtained by decoding the first internal command/address signal ICA_A through an ODT decoder of the first ODT signal generation circuit 12*a* corresponds to a first ODT decoding signal ODT_DEC_OUT_A and the first internal chip select signal ICS_A is at a high level, the first ODT command generation circuit 10*a* enables the first ODT decoding signal HODT_A. That is, the first ODT decoding signal HODT_A is generated according to the decoding result of the first control signal ICA_A and ICS_A. In order to adjust timing, the pulse width adjusting circuit 13*a* generates the first pulse width adjusted ODT signal ODT_1ST_A by adjusting the pulse width of the first ODT decoding signal HODT_A.

The first pulse width adjusted ODT signal ODT_1ST_A is inputted to the second ODT chip select signal control circuit 15*b* of the second ODT command generation circuit 10*b*. The second ODT chip select signal control circuit 15*b* enables the second CS controlled ODT signal HODT_1ST_A when the first pulse width adjusted ODT signal ODT_1ST_A and the chip select signal CS of the second control signal are all enabled. The pulse width adjusting circuit 16*b* generates the second ODT command ODT_2ND_B by adjusting the pulse width of the second CS controlled ODT signal HODT_1ST_A.

In the normal mode, the first ODT command generation circuit 10*a* generates the first pulse width adjusted ODT signal ODT_1ST_A based on the decoding result of the first control signal (command address signal CA and chip select signal CS). The first pulse width adjusted ODT signal ODT_1ST_A is transmitted to the second ODT command generation circuit 10*b*. When the first pulse width adjusted ODT signal ODT_1ST_A and the chip select signal ICS_B of the second internal control signal are all enabled, the second ODT command generation circuit 10*b* finally enables the second ODT command ODT_2ND_B.

The first ODT command ODT_2ND_A is generated in a symmetrical manner with the method for generating the second ODT command ODT_2ND_B. That is, the second ODT command generation circuit 10*b* generates the second pulse width adjusted ODT signal ODT_1ST_B based on the decoding result of the second control signal (command address signal CA and chip select signal CS). The second pulse width adjusted ODT signal ODT_1ST_B is transmitted to the first ODT chip select signal control circuit 15*a* of the first ODT command generation circuit 10*a*. When the second pulse width adjusted ODT signal ODT_1ST_B and the chip select signal ICS_A of the first internal control signal are all enabled, the first ODT chip select signal control circuit 15*a* finally enables the first ODT command ODT_2ND_A.

In this way, the set of first and second ODT commands ODT_2ND_A and ODT_2ND_B, that is, the ODT command is generated.

Next, the operation of the first and second ODT command generation circuits 10_a_ and 10_b_ in the 2N mode will be described.

In the 2N mode, the first and second control signals corresponding to the ODT command (that is, the set of the first and second ODT commands ODT_2ND_A and ODT_2ND_B) are sequentially inputted from the external device (not illustrated) in two cycles of the external clock CLK. Thus, the first and second control signals may be sequentially inputted to the first control signal receiver circuit 200_a_ which is operated based on the first internal clock CLK_A, or sequentially inputted to the second control signal receiver circuit 200_b_ which is operated based on the second internal clock CLK_B. Hereafter, the case in which the first and second control signals are sequentially inputted to the first control signal receiver circuit 200_a_ will be described. The first control signal receiver circuit 200_a_ generates the first internal control signals ICA_A and ICA_A at successive rising edges of the first internal clock CLK_A. The successive first internal control signals ICA_A and ICA_A are all transmitted to the first ODT command generation circuit 10_a_.

The process in which the first internal control signal ICA_A and ICS_A generated at the first rising edge of the first internal clock CLK_A and corresponding to the first control signal is inputted to the first ODT command generation circuit 10_a_ and then processed in the 2N mode is performed in the same manner as in the normal mode. In the 2N mode, however, the D flip-flop 14_a_ generates the first 2N mode ODT signal ODT_1ST_2N_A by synchronizing the first pulse width adjusted ODT signal ODT_1ST_A with the second internal clock CLK_B, in order to adjust timing. The first 2N mode ODT signal ODT_1ST_2N_A is transmitted to the first ODT chip select signal control circuit 15_a_.

The first internal control signal ICA_A and ICS_A generated at the two rising edge of the first internal clock CLK_A and corresponding to the second control signal is also inputted to the first ODT command generation circuit 10_a_. The first ODT chip select signal control circuit 15_a_ enables the first CS controlled ODT signal HODT_1ST_B when the first 2N mode ODT signal ODT_1ST_2N_A and the chip select signal CS of the second control signal are all enabled. The pulse width adjusting circuit 16_a_ generates the first ODT command ODT_2ND_A by adjusting the pulse width of the first CS controlled ODT signal HODT_1ST_B.

In the 2N mode, the first ODT command generation circuit 10_a_ generates the first 2N mode ODT signal ODT_1ST_2N_A based on the decoding result of the first control signal (command address signal CA and chip select signal CS). When the first 2N mode ODT signal ODT_1ST_2N_A and the chip select signal CS of the second control signal are all enabled, the first ODT command generation circuit 10_a_ finally enables the first ODT command ODT_2ND_A.

After the first internal control signal ICA_A and ICS_A corresponding to the first control signal was inputted to the first ODT command generation circuit 10_a_, the first internal control signal ICA_A and ICS_A corresponding to the second control signal is inputted to the first ODT command generation circuit 10_a_. The first ODT command generation circuit 10_a_ performs the same operation as the operation of processing the first internal control signal ICA_A and ICS_A corresponding to the first control signal, and generates the first 2N mode ODT signal ODT_1ST_2N_A based on the decoding result of the second control signal (command/address signal CA and chip select signal CS). When the first 2N mode ODT signal ODT_1ST_2N_A and the first internal chip select signal ICS_A corresponding to the first control signal are all enabled, the first ODT command generation circuit 10_a_ finally enables the first ODT command ODT_2ND_A.

In this way, the set of the first ODT command ODT_2ND_A generated on the basis of the decoding result of the first internal control signal ICA_A and ICS_A corresponding to the first control signal and the first ODT command ODT_2ND_A generated on the basis of the decoding result of the first internal control signal ICA_A and ICS_A corresponding to the second control signal, that is, the ODT command is generated.

Figure 3A:
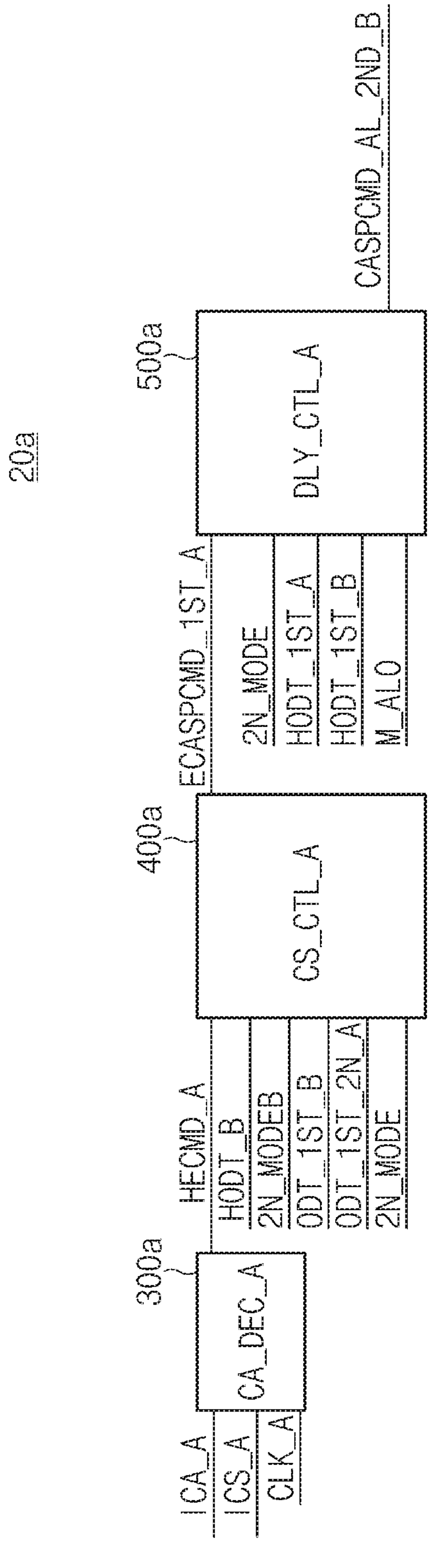
FIG. 3A is a circuit diagram of a first internal command generation circuit of FIG. 1.
Figure 3B:
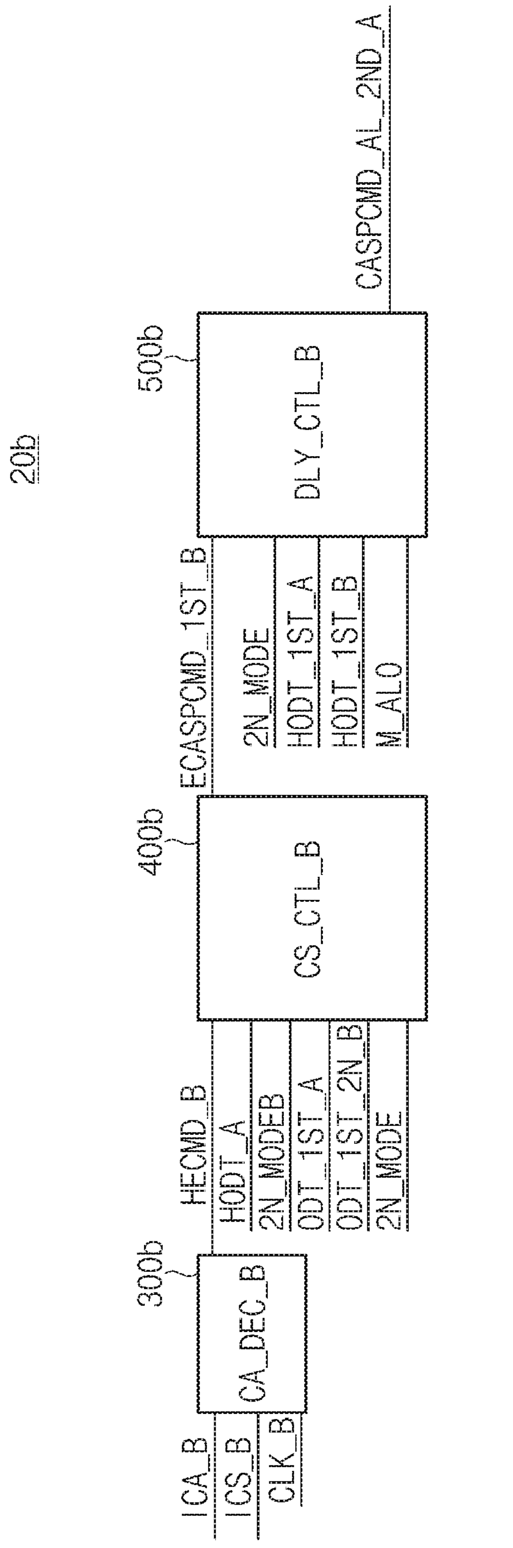
FIG. 3B is a circuit diagram of a second internal command generation circuit of FIG. 1.

FIG. 3A is a circuit diagram of the first internal command generation circuit 20_a_ of FIG. 1, and FIG. 3B is a circuit diagram of the second internal command generation circuit 20_b_ of FIG. 1.

Referring to FIG. 3A, the first internal command generation circuit 20_a_ includes a first command/address decoder (CA DEC) 300_a_, a first chip select signal control circuit 400_a_ and a first delay control circuit 500_a_.

The first command/address decoder 300_a_ generates a first decoding signal HECMD_A by decoding the first internal control signal (first internal command/address signal ICA_A and first internal chip select signal ICS_A). At this time, the first command/address decoder 300_a_ may generate the first decoding signal HECMD_A only when a decoding result of the first internal command/address signal ICA_A corresponds to a preset value and the first internal chip select signal ICS_A and the first internal clock CLK_A are enabled. For example, the first command/address decoder 300_a_ may generate a first write decoding signal HEWT_A when the decoding result of the first internal command/address signal ICA_A corresponds to a first value and the first internal chip select signal ICS_A and the first internal clock CLK_A are enabled. Furthermore, the first command/address decoder 300_a_ may enable a first read decoding signal HERD_A when the decoding result of the first internal command/address signal ICA_A corresponds to a second value and the first internal chip select signal ICS_A and the first internal clock CLK_A are enabled. In FIG. 3A, the first write decoding signal HEWT_A and the first read decoding signal HERD_A are represented by the first decoding signal HECMD_A.

The first chip select signal control circuit 400_a_ generates a first intermediate signal ECASPCMD_1ST_A based on the first decoding signal HECMD_A. At this time, the first chip select signal control circuit 400_a_ may disable the first intermediate signal ECASPCMD_1ST_A based on the second control signal.

For example, when the second ODT decoding signal HODT_B or the second pulse width adjusted ODT signal ODT_1ST_B is enabled in the normal mode, it may indicate that the first control signal serving as the base of the first decoding signal HECMD_A and the second control signal corresponding to the first control signal correspond to the ODT command. Therefore, in the normal mode, the first chip select signal control circuit 400_a_ disables the first intermediate signal ECASPCMD_1ST_A when the second ODT decoding signal HODT_B or the second pulse width adjusted ODT signal ODT_1ST_B is enabled, and generates the first intermediate signal ECASPCMD_1ST_A based on the first decoding signal HECMD_A when the second ODT decoding signal HODT_B and the second pulse width adjusted ODT signal ODT_1ST_B are disabled.

In the 2N mode, when the first 2N mode ODT signal ODT_1ST_2N_A is enabled, it may indicate that the first control signal serving as the base of the first decoding signal HECMD_A and the second control signal corresponding to the first control signal correspond to the ODT command. Therefore, in the 2N mode, the first chip select signal control circuit 400*a* disables the first intermediate signal ECASPCMD_1ST_A when the first 2N mode ODT signal ODT_1ST_2N_A is enabled, and generates the first intermediate signal ECASPCMD_1ST_A based on the first decoding signal HECMD_A when the first 2N mode ODT signal ODT_1ST_2N_A is disabled.

The first delay control circuit 500*a* generates the first internal command CASPCMD_AL_2ND_B by delaying the first intermediate signal ECASPCMD_1ST_A by a preset time. At this time, the first delay control circuit 500*a* disables the first internal command CASPCMD_AL_2ND_B when the first and second control signals correspond to the ODT command.

For example, when the second CS controlled ODT signal HODT_1ST_A is enabled in the normal mode, it may indicate that the pair of the first control signal corresponding to the first intermediate signal ECASPCMD_1ST_A and the second control signal corresponding to the first control signal corresponds to the ODT command. Thus, in the normal mode, the first delay control circuit 500*a* disables the first internal command CASPCMD_AL_2ND_B when the second CS controlled ODT signal HODT_1ST_A is enabled, and generates the first internal command CASPCMD_AL_2ND_B based on the first intermediate signal ECASPCMD_1ST_A when the second CS controlled ODT signal HODT_1ST_A is disabled.

Furthermore, when the first CS controlled ODT signal HODT_1ST_B is enabled in the 2N mode, it may indicate that the pair of the first control signal corresponding to the first intermediate signal ECASPCMD_1ST_A and the second control signal corresponding to the first control signal corresponds to the ODT command. Thus, in the 2N mode, the first delay control circuit 500*a* disables the first internal command CASPCMD_AL_2ND_B when the first CS controlled ODT signal HODT_1ST_B is enabled, and generates the first internal command CASPCMD_AL_2ND_B based on the first intermediate signal ECASPCMD_1ST_A when the first CS controlled ODT signal HODT_1ST_B is disabled.

Next, referring to FIG. 3B, the second internal command generation circuit 20*b* will be described.

The second internal command generation circuit 20*b* processes the second internal control signal (second internal command/address ICA_B and second internal chip select signal ICS_B) generated in synchronization with the second internal clock CLK_B, unlike the first internal command generation circuit 20*a*. The second internal command generation circuit 20*b* may receive and process the second internal control signal ICA_B and ICS_B corresponding to the second control signal in the normal mode, and sequentially receive and process the second internal control signal ICA_B and ICS_B corresponding to the first control signal and the second internal control signal ICA_B and ICS_B corresponding to the second control signal in the 2N mode.

The second internal command generation circuit 20*b* includes a second command/address decoder 300*b*, a second chip select signal control circuit 400*b* and a second delay control circuit 500*b*.

The second command/address decoder 300*b* generates a second decoding signal HECMD_B by decoding the second internal control signal (second internal command/address signal ICA_B and second internal chip select signal ICS_B). The second command/address decoder 300*b* may generate the second decoding signal HECMD_B only when the decoding result of the second internal command/address signal ICA_B corresponds to a preset value and the second internal chip select signal ICS_B and the second internal clock CLK_B are enabled. At this time, the second decoding signal HECMD_B represents one of various signals which are generated by decoding the second internal control signal (second internal command/address signal ICA_B and second internal chip select signal ICS_B), like the first decoding signal HECMD_A.

The second chip select signal control circuit 400*b* generates a second intermediate signal ECASPCMD_1ST_B based on the second decoding signal HECMD_B. At this time, the second chip select signal control circuit 400*b* may disable the second intermediate signal ECASPCMD_1ST_B based on a signal of the first and second control signals, on which the second decoding signal HECMD_B is not based. In other words, since the second decoding signal HECMD_B is generated based on the second control signal in the normal mode, the second chip select signal control circuit 400*b* may disable the second intermediate signal ECASPCMD_1ST_B based on the first control signal in the normal mode. Furthermore, since the second decoding signal HECMD_B may be generated based on the first control signal in the 2N mode, the second chip select signal control circuit 400*b* may disable the second intermediate signal ECASPCMD_1ST_B based on the second control signal in the 2N mode.

For example, when the first ODT decoding signal HODT_A or the first pulse width adjusted ODT signal ODT_1ST_A is enabled in the normal mode, it may indicate that the second control signal serving as the base of the second decoding signal HECMD_B and the first control signal corresponding to the second control signal correspond to the ODT command. Therefore, in the normal mode, the second chip select signal control circuit 400*b* disables the second intermediate signal ECASPCMD_1ST_B when the first ODT decoding signal HODT_A or the first pulse width adjusted ODT signal ODT_1ST_A is enabled, and generates the second intermediate signal ECASPCMD_1ST_B based on the second decoding signal HECMD_B when the first ODT decoding signal HODT_A and the first pulse width adjusted ODT signal ODT_1ST_A are disabled.

Furthermore, when the second 2N mode ODT signal ODT_1ST_2N_B is enabled in the 2N mode, it may indicate that the first control signal serving as the base of the second decoding signal HECMD_B and the second control signal corresponding to the first control signal correspond to the ODT command. Therefore, the second chip select signal control circuit 400*b* disables the second intermediate signal ECASPCMD_1ST_B when the second 2N mode ODT signal ODT_1ST_2N_B is enabled, and generates the second intermediate signal ECASPCMD_1ST_B based on the second decoding signal HECMD_B when the second 2N mode ODT signal ODT_1ST_2N_B is disabled.

The second delay control circuit 500*b* generates the second internal command CASPCMD_AL_2ND_A by delaying the second intermediate signal ECASPCMD_1ST_B by a preset time. At this time, the second delay control circuit 500*b* disables the second internal command CASPCMD_AL_2ND_A when the first and second control signals correspond to the ODT command.

For example, when the first CS controlled ODT signal HODT_1ST_B is enabled in the normal mode, it may indicate that the pair of the second control signal corresponding to the second intermediate signal ECASPCMD_1ST_B and the first control signal corresponding to the second control signal corresponds to the ODT command. Thus, in the normal mode, the second delay control circuit 500*b* disables the second internal command CASPCMD_AL_2ND_A when the first CS controlled ODT signal HODT_1ST_B is enabled, and generates the second internal command CASPCMD_AL_2ND_A based on the second intermediate signal ECASPCMD_1ST_B when the first CS controlled ODT signal HODT_1ST_B is disabled.

Furthermore, when the second CS controlled ODT signal HODT_1ST_A is enabled in the 2N mode, it may indicate that the pair of the first control signal corresponding to the second intermediate signal ECASPCMD_1ST_B and the second control signal corresponding to the first control signal corresponds to the ODT command. Thus, in the 2N mode, the second delay control circuit 500*b* disables the second internal command CASPCMD_AL_2ND_A when the second CS controlled ODT signal HODT_1ST_A is enabled, and generates the second internal command CASPCMD_AL_2ND_A based on the second intermediate signal ECASPCMD_1ST_B when the second CS controlled ODT signal HODT_1ST_A is disabled.

Referring to FIGS. 1, 2A, 2B, 3A and 3B, the first internal command generation circuit 20*a* generates the first internal command CASPCMD_AL_2ND_B using the second ODT decoding signal HODT_B, the first 2N mode ODT signal ODT_1ST_2N_A, the second internal ODT signal ODT_1ST_B, the second CS controlled ODT signal HODT_1ST_A and the first CS controlled ODT signal HODT_1ST_B, in addition to the first internal control signal ICA_A and ICS_A. Furthermore, the second internal command generation circuit 20*b* generates the second internal command CASPCMD_AL_2ND_A using the first ODT decoding signal HODT_A, the first internal ODT signal ODT_1ST_A, the second 2N mode ODT signal ODT_1ST_2N_B, the second CS controlled ODT signal HODT_1ST_A and the first CS controlled ODT signal HODT_1ST_B, in addition to the second internal control signal ICA_B and ICS_B. Therefore, the first ODT decoding signal HODT_A, the second ODT decoding signal HODT_B, the first internal ODT signal ODT_1ST_A, the second internal ODT signal ODT_1ST_B, the first 2N mode ODT signal ODT_1ST_2N_A, the second 2N mode ODT signal ODT_1ST_2N_B, the second CS controlled ODT signal HODT_1ST_A and the first CS controlled ODT signal HODT_1ST_B may correspond to the ODT control signals ODT_CTL_SIGs illustrated in FIG. 1.

Figure 4A:
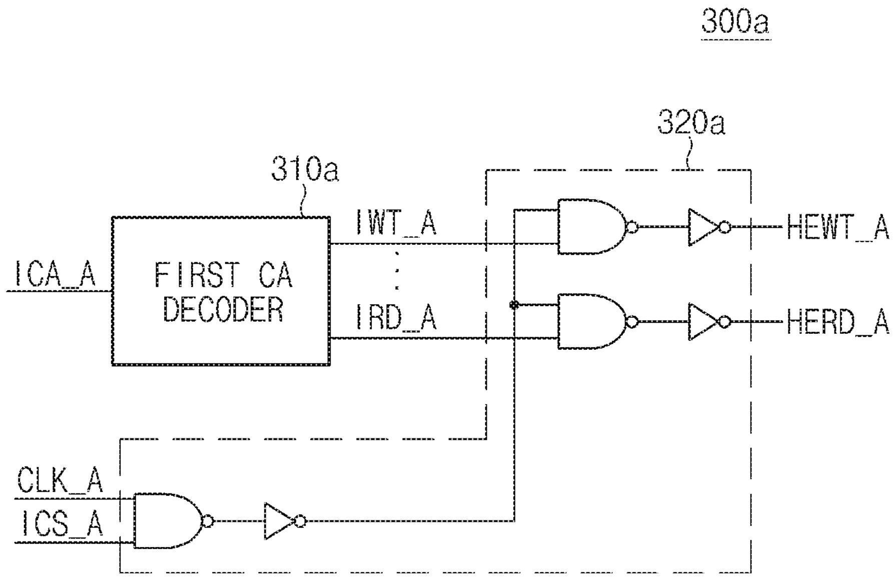
FIG. 4A is a circuit diagram of a first command and address (command/address) decoder of FIG. 3A.
Figure 4B:
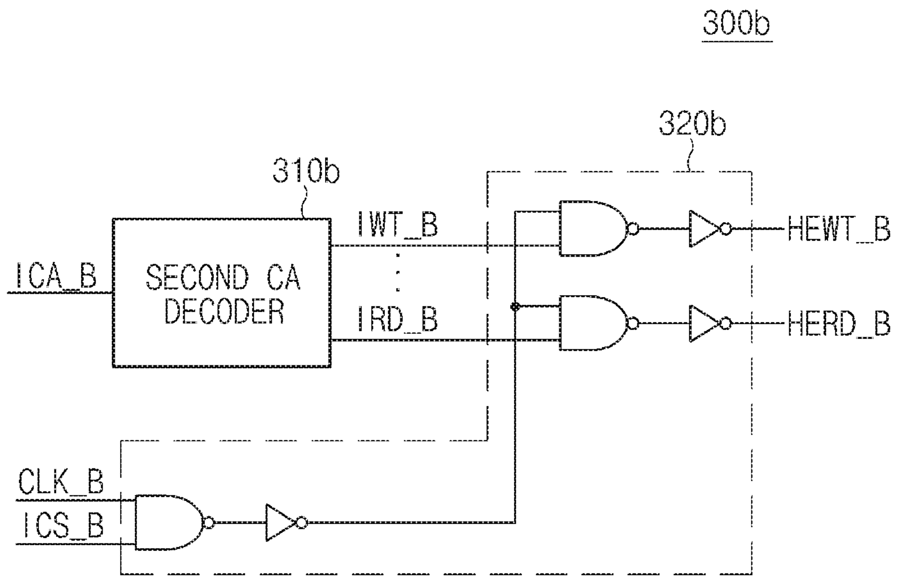
FIG. 4B is a circuit diagram of a second command/address decoder of FIG. 3B.

FIG. 4A is a circuit diagram of the first command/address decoder 300*a* of FIG. 3A, and FIG. 4B is a circuit diagram of the second command/address decoder 300*b* of FIG. 3B.

Referring to FIG. 4A, the first command/address decoder 300*a* includes a first CA decoder 310*a* and a first CS decoder 320*a*.

The first CA decoder 310*a* generates first intermediate decoding signals IWT_A and IRD_A by decoding the first internal command/address signal ICA_A.

When the first internal clock CLK_A and the first internal chip select signal ICS_A are enabled, the first CS decoder 320*a* outputs the first intermediate decoding signals IWT_A and IRD_A as the first decoding signals HEWT_A and HERD_A. The first decoding signal HECMD_A of FIG. 3A represents the first decoding signals HEWT_A and HERD_A.

The first ODT decoding signal HODT_A of FIG. 2A may be enabled at the same time as one of the first decoding signals HEWT_A and HERD_A of FIG. 3A, for example, the first decoding signal H EWT_A.

The first decoding signals HEWT_A and HERD_A are transmitted to the first chip select signal control circuit 400*a*.

Since the second command/address decoder 300*b* illustrated in FIG. 4B has the same structure as the first command/address decoder 300*a*, except that input/output signals are based on the second internal clock CLK_B, the detailed descriptions thereof are omitted herein.

Figure 5A:
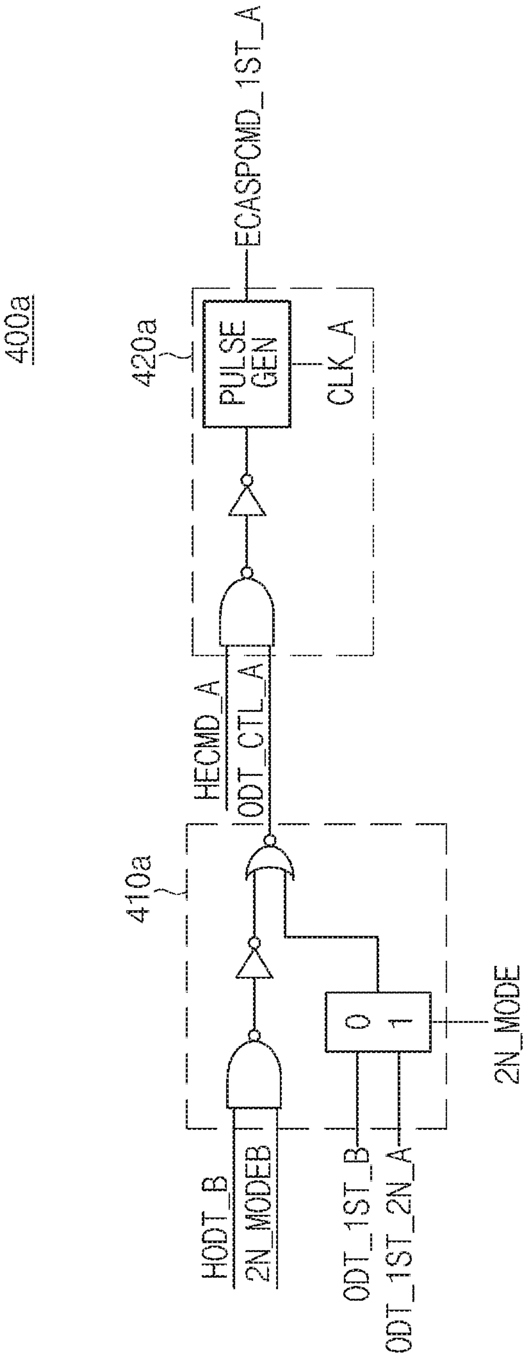
FIG. 5A is a circuit diagram of a first chip select signal control circuit of FIG. 3A.
Figure 5B:
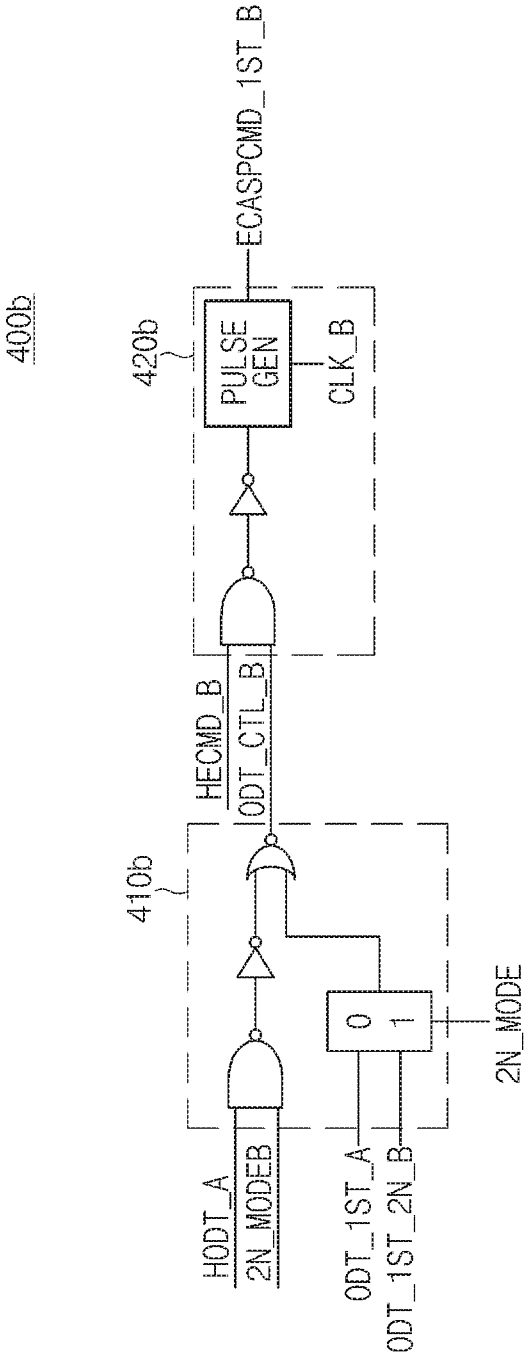
FIG. 5B is a circuit diagram of a second chip select signal control circuit of FIG. 3B.

FIG. 5A is a circuit diagram of the first chip select signal control circuit 400*a* of FIG. 3A, and FIG. 5B is a circuit diagram of the second chip select signal control circuit 400*b* of FIG. 3B.

Referring to FIG. 5A, the first chip select signal control circuit 400*a* includes a first ODT control signal generation circuit 410*a* and a first intermediate signal generation circuit 420*a*.

The first ODT control signal generation circuit 410*a* generates a first ODT control signal ODT_CTL_A indicating whether the second control signal corresponds to the ODT command. When the second ODT decoding signal HODT_B or the second internal ODT signal ODT_1ST_B is enabled in the normal mode, it may indicate that the second control signal serving as the base of the second ODT decoding signal HODT_B corresponds to the ODT command. Thus, in the normal mode, the first ODT control signal generation circuit 410*a* may enable the first ODT control signal ODT_CTL_A to a low level when the second ODT decoding signal HODT_B or the second internal ODT signal ODT_1ST_B is enabled. Furthermore, the first ODT control signal generation circuit 410*a* may disable the first ODT control signal ODT_CTL_A to a high level when the second ODT decoding signal HODT_B or the second internal ODT signal ODT_1ST_B is disabled.

In the 2N mode, the first internal control signal ICA_A and ICS_A corresponding to the first control signal and the first internal control signal ICA_A and ICS_A corresponding to the second control signal are sequentially inputted to the first internal command generation circuit 20*a*. Therefore, the first ODT control signal generation circuit 410*a* may generate the first ODT control signal ODT_CTL_A based on the first 2N mode ODT signal ODT_1ST_2N_A which is a value obtained by delaying the first ODT decoding signal HODT_A generated through the first command/address decoder 300*a*. That is, in the 2N mode, the first ODT control signal generation circuit 410*a* enables the first ODT control signal ODT_CTL_A to a low level when the first 2N mode ODT signal ODT_1ST_2N_A is enabled, and disables the first ODT control signal ODT_CTL_A to a high level when the first 2N mode ODT signal ODT_1ST_2N_A is disabled.

Referring to FIG. 5A, the first ODT control signal generation circuit 410*a* may include a NAND operator for performing a NAND operation on the second ODT decoding signal HODT_B and an inverted 2N mode signal 2N_MODEB, a negation operator for inverting an output of the NAND operator, a multiplexer for selecting any one of ODT_1ST_B and ODT_1ST_2N_A based on the 2N mode signal 2N_MODE, and a NOR operator for performing a NOR operation on an output of the negation operator and an output of the multiplexer.

The first intermediate signal generation circuit 420*a* may generate the first intermediate signal ECASPCMD_1ST_A based on the first ODT control signal ODT_CTL_A and the first decoding signal HECMD_A. The first intermediate signal generation circuit 420*a* disables the first intermediate signal ECASPCMD_1ST_A when the first ODT control signal ODT_CTL_A is enabled or the second control signal corresponds to the ODT command. The first intermediate signal generation circuit 420*a* generates the first intermediate signal ECASPCMD_1ST_A based on the first decoding signal HECMD_A, when the first ODT control signal ODT_CTL_A is disabled or the second control signal does not correspond to the ODT command. At this time, the first intermediate signal ECASPCMD_1ST_A may have an adjusted pulse width, compared to the first decoding signal HECMD_A.

Since the second chip select signal control circuit 400_b_ of FIG. 5B has the same structure as the first chip select signal control circuit 400_a_ except that input/output signals are different, the detailed descriptions thereof are omitted herein.

Figure 6A:
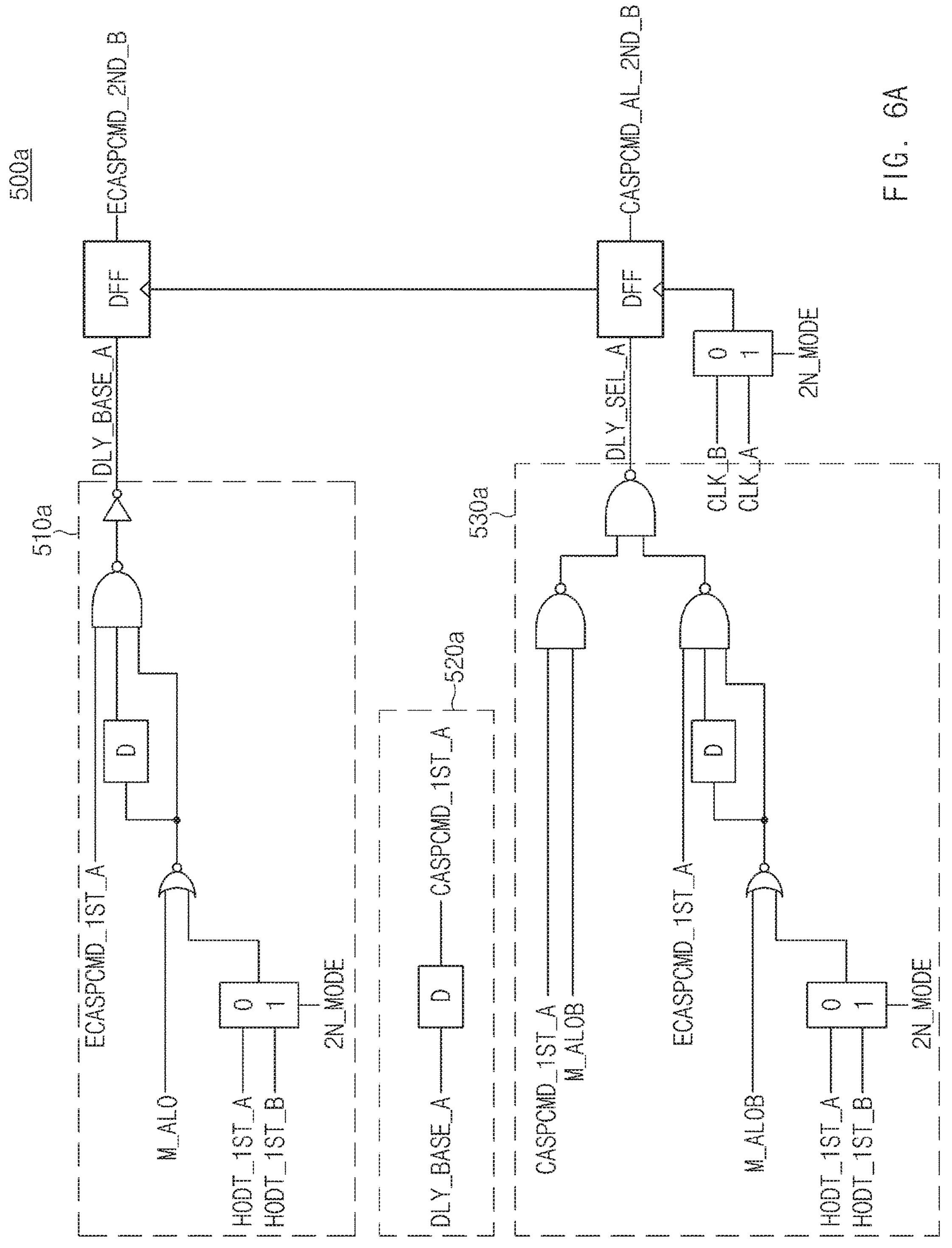
FIG. 6A is a circuit diagram of a first delay control circuit of FIG. 3A.
Figure 6B:
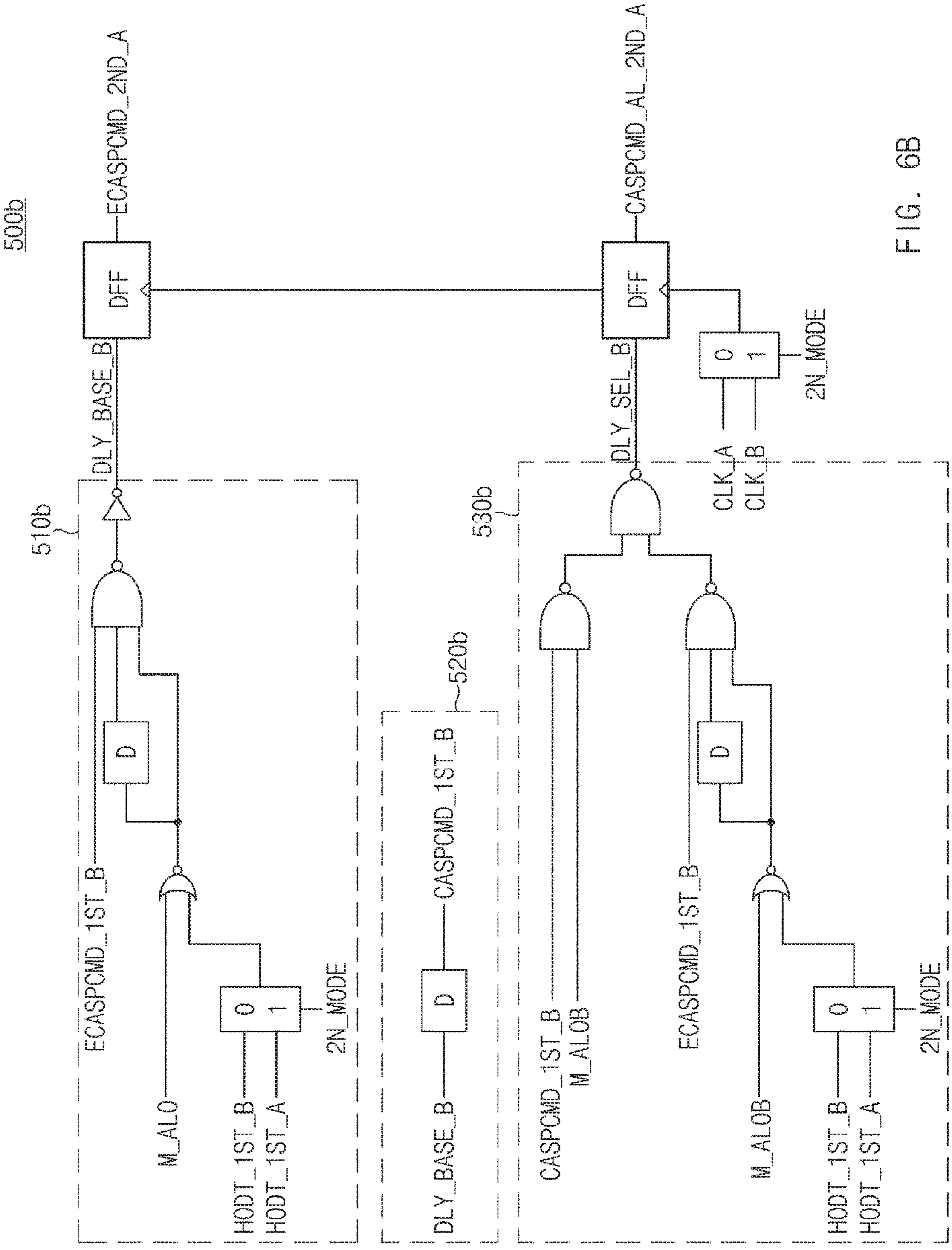
FIG. 6B is a circuit diagram of a second delay control circuit of FIG. 3B.

FIG. 6A is a circuit diagram of the first delay control circuit 500_a_ of FIG. 3A, and FIG. 6B is a circuit diagram of the second delay control circuit 500_b_ of FIG. 3B.

Referring to FIG. 6A, the first delay control circuit 500_a_ includes a first delay base signal generation circuit 510_a_, a first delay signal generation circuit 520_a_ and a first delay selection circuit 530_a_.

The first delay base signal generation circuit 510_a_ outputs the first intermediate signal ECASPCMD_1ST_A as a first delay base signal DLY_BASE_A, based on a delay signal M_AL0. The delay signal M_AL0 indicating whether a delay is 0 may be set in response to the first intermediate signal ECASPCMD_1ST_A.

For example, when the delay signal M_AL0 is enabled or the delay of the first intermediate signal ECASPCMD_1ST_A is 0, the first delay base signal generation circuit 510_a_ disables the first delay base signal DLY_BASE_A. Furthermore, when the delay signal M_AL0 is disabled or the delay of the first intermediate signal ECASPCMD_1ST_A is not 0, the first delay base signal generation circuit 510_a_ enables the first delay base signal DLY_BASE_A.

At this time, the first delay base signal generation circuit 510_a_ disables the first delay base signal DLY_BASE_A when the control signal serving as the base of the first intermediate signal ECASPCMD_1ST_A corresponds to the ODT command. Furthermore, when the control signal serving as the base of the first intermediate signal ECASPCMD_1ST_A does not correspond to the ODT command, the first delay base signal generation circuit 510_a_ generates the first delay base signal DLY_BASE_A based on the first intermediate signal ECASPCMD_1ST_A.

For example, in the normal mode, the first intermediate signal ECASPCMD_1ST_A is generated based on the first internal control signal ICA_A and ICS_A corresponding to the first control signal. Furthermore, when the first control signal corresponds to the ODT command, the first control signal is sequentially converted into the first ODT decoding signal HODT_A and the first pulse width adjusted ODT signal ODT_1ST_A, and then outputted as the second CS controlled ODT signal HODT_1ST_A, as illustrated in FIG. 2A. That is, when the second CS controlled ODT signal HODT_1ST_A is enabled in the normal mode, the first control signal serving as the base of the first intermediate signal ECASPCMD_1ST_A corresponds to the ODT command. Therefore, when the second CS controlled ODT signal HODT_1ST_A is enabled in the normal mode, the first delay base signal generation circuit 510_a_ disables the first delay base signal DLY_BASE_A.

In the 2N mode, the first intermediate signal ECASPCMD_1ST_A is generated based on the first internal control signal ICA_A and ICS_A corresponding to the first control signal. Furthermore, when the first control signal corresponds to the ODT command, the first control signal is sequentially converted into the first ODT decoding signal HODT_A, the first pulse width adjusted ODT signal ODT_1ST_A and the first 2N mode ODT signal ODT_1ST_2N_A, and then outputted as the first CS controlled ODT signal HODT_1ST_B, as illustrated in FIG. 2A. That is, when the first CS controlled ODT signal HODT_1ST_B is enabled in the 2N mode, the first control signal serving as the base of the first intermediate signal ECASPCMD_1ST_A corresponds to the ODT command. Therefore, when the first CS controlled ODT signal HODT_1ST_B is enabled in the 2N mode, the first delay base signal generation circuit 510_a_ disables the first delay base signal DLY_BASE_A.

Referring to FIG. 6A, the first delay base signal generation circuit 510_a_ may include a multiplexer for generating any one of the second CS controlled ODT signal HODT_1ST_A and the first CS controlled ODT signal ODT_1ST_B based on the 2N mode signal 2N_MODE, a NOR operator for performing a NOR operation on an output of the multiplexer and the delay signal M_AL0, a NAND operator for performing a NAND operation on an output value of the NOR operator, a value obtained by delaying the output value of the NOR operator, and the first intermediate signal ECASPCMD_1ST_A, and a negation operator for inverting an output value of the NAND operator.

The first delay signal generation circuit 520_a_ generates a first delay intermediate signal CASPCMD_1ST_A by delaying the first delay base signal DLY_BASE_A by a preset value. The delay amount of the first delay base signal DLY_BASE_A may be preset in response to the first intermediate signal ECASPCMD_1ST_A.

The first delay selection circuit 530_a_ selectively outputs the first intermediate signal ECASPCMD_1ST_A or the first delay intermediate signal CASPCMD_1ST_A, based on an inverted delay signal M_AL0B. When the inverted delay signal M_AL0B is disabled or the delay is 0, the first delay selection circuit 530_a_ outputs the first intermediate signal ECASPCMD_1ST_A. When the inverted delay signal M_AL0B is enabled or the delay is not 0, the first delay selection circuit 530_a_ outputs the first delay intermediate signal CASPCMD_1ST_A.

At this time, the first delay base signal generation circuit 530_a_ disables a first delay select signal DLY_SEL_A when the first control signal serving as the base of the first intermediate signal ECASPCMD_1ST_A corresponds to the ODT command.

As described above, when the second CS controlled ODT signal HODT_1ST_A is enabled in the normal mode, the first control signal serving as the base of the first intermediate signal ECASPCMD_1ST_A corresponds to the ODT command. Therefore, when the second CS controlled ODT signal HODT_1ST_A is enabled in the normal mode, the first delay selection circuit 530_a_ disables the first delay base signal DLY_BASE_A.

In the 2N mode, when the first CS controlled ODT signal HODT_1ST_B is enabled, the first control signal serving as the base of the first intermediate signal ECASPCMD_1ST_A corresponds to the ODT command. Therefore, when the first CS controlled ODT signal HODT_1ST_B is enabled in the 2N mode, the first delay selection circuit 530_a_ disables the first delay select signal DLY_SEL_A.

Referring to FIG. 6A, the first delay selection circuit 530_a_ may include a multiplexer for generating any one of HODT_1ST_A and HODT_1ST_B based on the 2N mode signal 2N_MODE, a NOR operator for performing a NOR operation on an output value of the multiplexer and the inverted delay signal M_AL0B, a NAND operator for performing a NAND operation on an output value of the NOR operator, a value obtained by delaying the output value of the NOR operator, and the first intermediate signal ECASPCMD_1ST_A, and a NAND operator for generating the first delay select signal DLY_SEL_A by performing a NAND operation on output values of the two NAND operators.

The pair of the first delay base signal DLY_BASE_A generated by the first delay base signal generation circuit 510*a* and the first delay select signal DLY_SEL_A generated by the first delay selection circuit 530*a* is outputted as the first internal command ECASPCMD_2ND_B or CASPCMD_AL_2ND_B in synchronization with the second internal clock CLK_B in the normal mode or the first internal clock CLK_A in the 2N mode.

Since the second delay control circuit 500*b* of FIG. 6B has the same structure as the first delay control circuit 500*a* of FIG. 6A, except that input/output signals are different, the detailed descriptions thereof are omitted herein.

Figure 7:
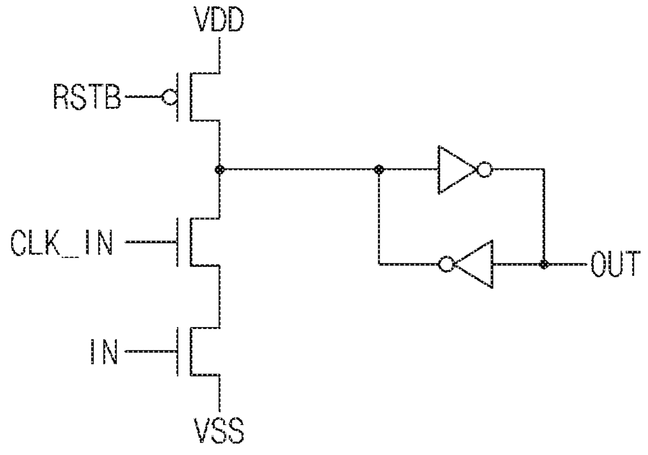
FIG. 7 is a circuit diagram illustrating pulse width adjusting circuits 13*a* and 16*a* of FIG. 2A, pulse width adjusting circuits 13*b* and 16*b* of FIG. 2B, a pulse width adjusting circuit in a first intermediate signal generation circuit 420*a* of FIG. 5A, and a pulse width adjusting circuit in a first intermediate signal generation circuit 420*b* of FIG. 5B.

FIG. 7 is a circuit diagram illustrating the pulse width adjusting circuits 13*a* and 16*a* of FIG. 2A, the pulse width adjusting circuits 13*b* and 16*b* of FIG. 2B, the pulse width adjusting circuit within the first intermediate signal generation circuit 420*a* of FIG. 5A, and the pulse width adjusting circuit in the first intermediate signal generation circuit 420*b* of FIG. 5B.

In FIG. 7, an input signal of each pulse width adjusting circuits is represented by IN, an output signal of each pulse width adjusting circuit is represented by OUT, and a clock signal serving as a reference signal is represented by CLK_IN. For example, in the pulse width adjusting circuit 13*a* of FIG. 2A, the first ODT decoding signal HODT_A corresponds to the input signal IN, the first pulse width adjusted ODT signal ODT_1ST_A corresponds to the output signal OUT, and the first internal clock CLK_A corresponds to the reference clock CLK_IN. When an inverted reset signal RSTB is enabled to a low level, the pulse width adjusting circuit of FIG. 7 generates the output signal OUT by adjusting the pulse width of the input signal IN to the cycle of the reference clock CLK_IN. As illustrated in FIG. 7, for example, in an embodiment, the pulse width adjusting circuit may receive a source voltage VDD and a ground voltage VSS.

The case in which a control signal corresponding to an internal command, which is not the ODT command, is inputted in the normal mode will be described with reference to FIG. 8A.

Figure 8A:
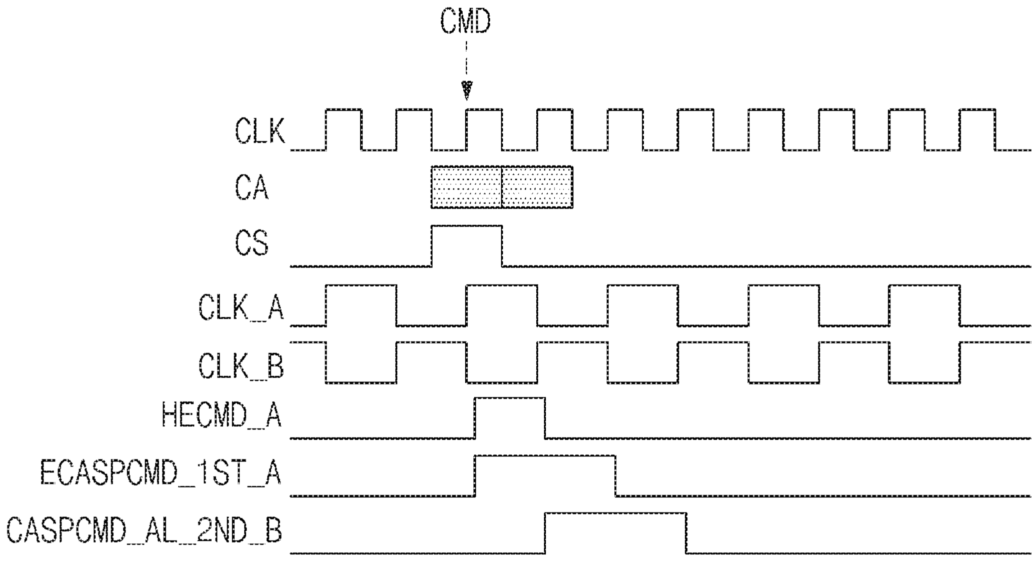
FIG. 8A is a timing diagram illustrating a part of signals of the first internal command generation circuit when an internal command which is not an ODT command is inputted in a normal mode.

FIG. 8A is a timing diagram illustrating a part of the signals of the second internal command generation circuit 20*a* when the internal command, not the ODT command, is inputted in the normal mode.

Referring to FIG. 8A, the command/address signal CA and the chip select signal CS are inputted during two cycles of an external clock CLK, the chip select signal CS having a high level during the first cycle of the external clock CLK and having a low level during the second cycle of the external clock CLK. The command/address signal CA and the high-level chip select signal CS, which are inputted during the first cycle of the external clock, correspond to the first control signal, and the command/address signal CA and the low-level chip select signal CS, which are inputted during the second cycle of the external clock, correspond to the second control signal. In FIG. 8A, an arrow indicates an input timing of the two-cycle command CMD.

The internal clock generation circuit 100 generates the first internal clock CLK_A enabled at an odd-numbered cycle of the external clock and the second internal clock CLK_B enabled at an even-numbered cycle of the external clock.

Although not illustrated in FIG. 8A, the first control signal receiver circuit 200*a* receives the first control signal, that is, the command/address signal CA and the chip select signal CS which are inputted in the first cycle of the external clock CLK, and generates the first internal control signal synchronized with the first internal clock CLK_A, that is, the first internal command/address signal ICA_A and the first internal chip select signal ICS_A (refer to FIG. 3A).

The first command/address decoder 300*a* generates the first decoding signal HECMD_A by decoding the first internal control signal, that is, the first internal command/address signal ICA_A and the first internal chip select signal ICS_A (refer to FIG. 4A).

The first chip select signal control circuit 400*a* generates a first intermediate signal ECASPCMD_1ST_A based on the first decoding signal HECMD_A. At this time, although not illustrated in FIG. 8A, the second ODT decoding signal HODT_B and the second pulse width adjusted ODT signal ODT_1ST_B are disabled because the second control signal does not correspond to the ODT command. Therefore, the first intermediate signal ECASPCMD_1ST_A is not disabled but outputted. The first intermediate signal ECASPCMD_1ST_A has a pulse width which is adjusted by the internal pulse width adjusting circuit and corresponds to the cycle of the first internal clock CLK_A (refer to FIG. 5A).

The first delay control circuit 500*a* generates the first internal command CASPCMD_AL_2ND_B by delaying the first intermediate signal ECASPCMD_1ST_A by a preset time. At this time, although not illustrated in FIG. 8A, the second CS controlled ODT signal HODT_1ST_A is disabled because the first control signal does not correspond to the ODT command. Therefore, the first internal command CASPCMD_AL_2ND_B is not disabled but outputted. The first internal command CASPCMD_AL_2ND_B is outputted in synchronization with the second internal clock CLK_B (refer to FIG. 6A).

Next, the case in which the ODT command is inputted in the normal mode will be described with reference to FIG. 8B.

Figure 8B:
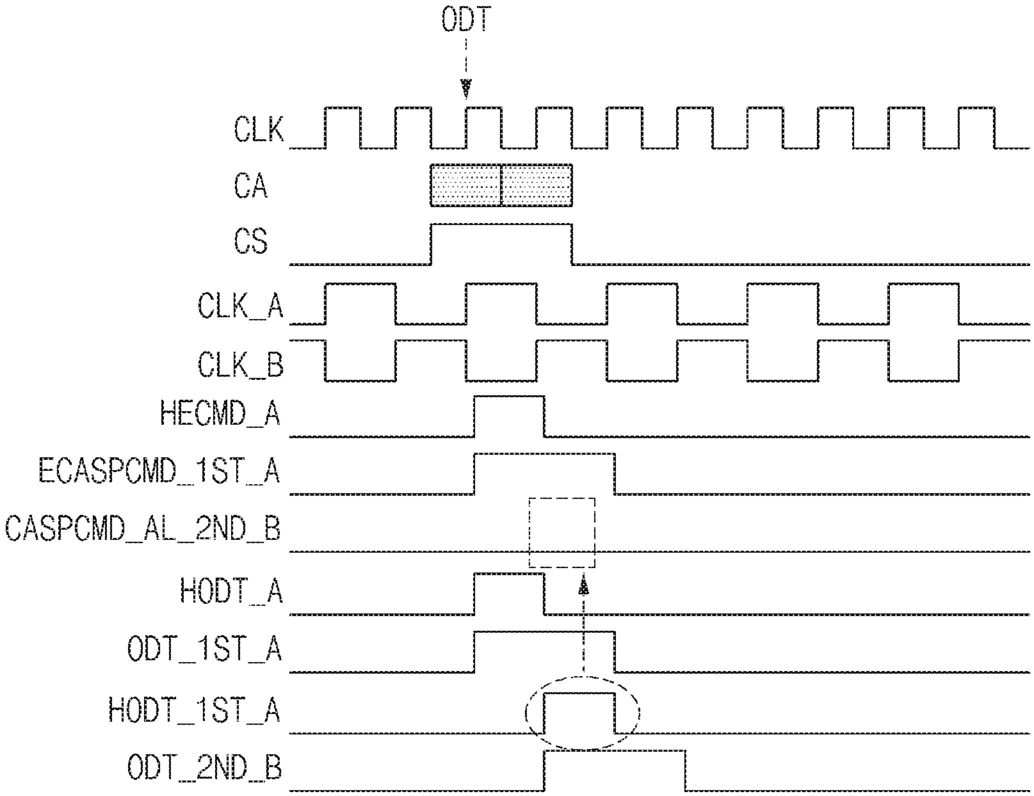
FIG. 8B is a timing diagram illustrating a part of signals of the first ODT command generation circuit and the first internal command generation circuit when the ODT command is inputted in the normal mode.

FIG. 8B is a timing diagram illustrating a part of the signals of the first ODT command generation circuit 10*a* and the first internal command generation circuit 20*a* when the ODT command is inputted in the normal mode.

Referring to FIG. 8B, the command/address signal CA and the chip select signal CS are inputted during two cycles of the external clock CLK, the chip select signal CS having a high level during two cycles of the external clock CLK. The command/address signal CA and the high-level chip select signal CS, which are inputted during the first cycle of the external clock, correspond to the first control signal, and the command/address signal CA and the high-level chip select signal CS, which are inputted during the second cycle of the external clock, correspond to the second control signal. In FIG. 8A, an arrow indicates an input timing of the ODT command.

The internal clock generation circuit 100 generates the first internal clock CLK_A and the second internal clock CLK_B in the same manner as in FIG. 8*a*.

Furthermore, although not illustrated in FIG. 8B, the first control signal receiver circuit 200*a* receives the first control signal, that is, the command/address signal CA and the chip select signal CS which are inputted in the first cycle of the external clock CLK, and generates the first internal control signal synchronized with the first internal clock CLK_A, that is, the first internal command/address signal ICA_A and the first internal chip select signal ICS_A (refer to FIG. 1).

The present embodiment is based on the supposition that an input control signal including the first and second control signals corresponds to the ODT command, but a value obtained by decoding the first internal control signal corresponds to both of the first decoding signal HECMD_A and the first ODT decoding signal HODT_A. Therefore, the first ODT signal generation circuit 12a enables the first ODT decoding signal HODT_A. The first command/address decoder 300a enables the first decoding signal HECMD_A.

The pulse width adjusting circuit 13a generates the first pulse width adjusted ODT signal ODT_1ST_A by adjusting the pulse width of the first ODT decoding signal HODT_A to the cycle of the first internal clock CLK_A.

Since the second internal chip select signal ICS_B is at a high level, the second ODT chip select signal control circuit 15b generates the second CS controlled ODT signal HODT_1ST_A from the first pulse width adjusted ODT signal ODT_1ST_A, the second CS controlled ODT signal HODT_1ST_A being enabled only during a period in which the second internal clock CLK_B is at a high level.

The pulse width adjusting circuit 16b generates the second ODT command ODT_2ND_B by adjusting the pulse width of the second CS controlled ODT signal HODT_1ST_A to the cycle of the second internal clock CLK_B.

The first chip select control circuit 400a generates the first intermediate signal ECASPCMD_1ST_A by adjusting the pulse width of the first decoding signal HECMD_A to the cycle of the first internal clock CLK_A.

The first delay control circuit 500a disables the first internal command ECASPCMD_2ND_B because the second CS controlled ODT signal HODT_1ST_A is enabled.

As a result, when the ODT command is inputted in the normal mode, the internal command corresponding to the ODT command, that is, the second ODT command ODT_2ND_B may be outputted, and the internal command which is not the ODT command, that is, the first internal command CASPCMD_AL_2ND_B may not be outputted.

Next, the case in which a command which is not the ODT command is inputted in the 2N mode will be described with reference to FIG. 9A.

Figure 9A:
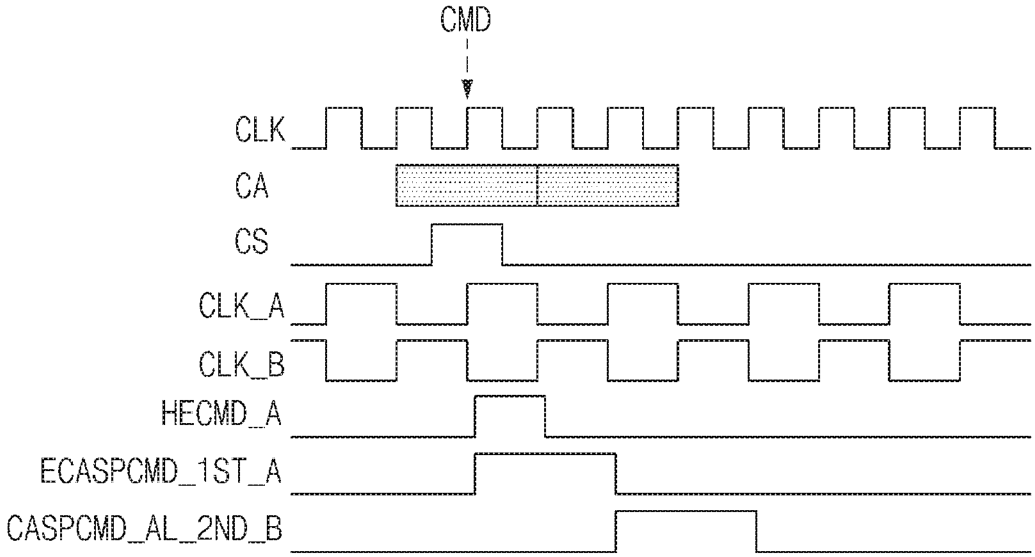
FIG. 9A is a timing diagram illustrating a part of signals of the first internal command generation circuit when a command which is not the ODT command is inputted in the 2N mode.

FIG. 9A is a timing diagram illustrating a part of the signals of the first internal command generation circuit 20a when a command which is not the ODT command is inputted in the 2N mode.

Referring to FIG. 9A, two cycles of the external clock CLK are set to a unit cycle in the 2N mode, and a control signal corresponding to a two-cycle command is inputted. That is, in the normal mode, the first control signal is inputted in the first cycle of the external clock CLK, and the second control signal is inputted in the second cycle of the external clock CLK (refer to FIG. 8A). In the 2N mode, however, the first control signal is inputted during two cycles of the external clock CLK, and the second control signal is inputted during the next two cycles of the external clock CLK.

In the 2N mode, the internal signals may be generated in the same manner as in the normal mode, except that the input cycle of the control signals (that is, the first and second signals) is doubled in comparison to in the normal mode.

That is, the first internal clock CLK_A and the second internal clock CLK_B are generated by the internal clock generation circuit 100 as in the normal mode. Furthermore, the first control signal receiver circuit 200a receives the first control signal, and generates the first internal control signal synchronized with the first internal clock CLK_A, that is, the first internal command/address signal ICA_A and the first internal chip select signal ICS_A. The first command/address decoder 300a generates the first decoding signal HECMD_A by decoding the first internal control signal (first internal command/address signal ICA_A and first internal chip select signal ICS_A). The first chip select signal control circuit 400a generates the first intermediate signal ECASPCMD_1ST_A based on the first decoding signal HECMD_A.

In the 2N mode, the first delay control circuit 500a generates the first internal command CASPCMD_AL_2ND_B by synchronizing the first intermediate signal ECASPCMD_1ST_A with the first internal signal CLK_A. Thus, in the 2N mode, the first internal command CASPCMD_AL_2ND_B is generated at a different time from in the normal mode.

Next, the case in which the ODT command is inputted in the 2N mode will be described with reference to FIG. 9B.

Figure 9B:
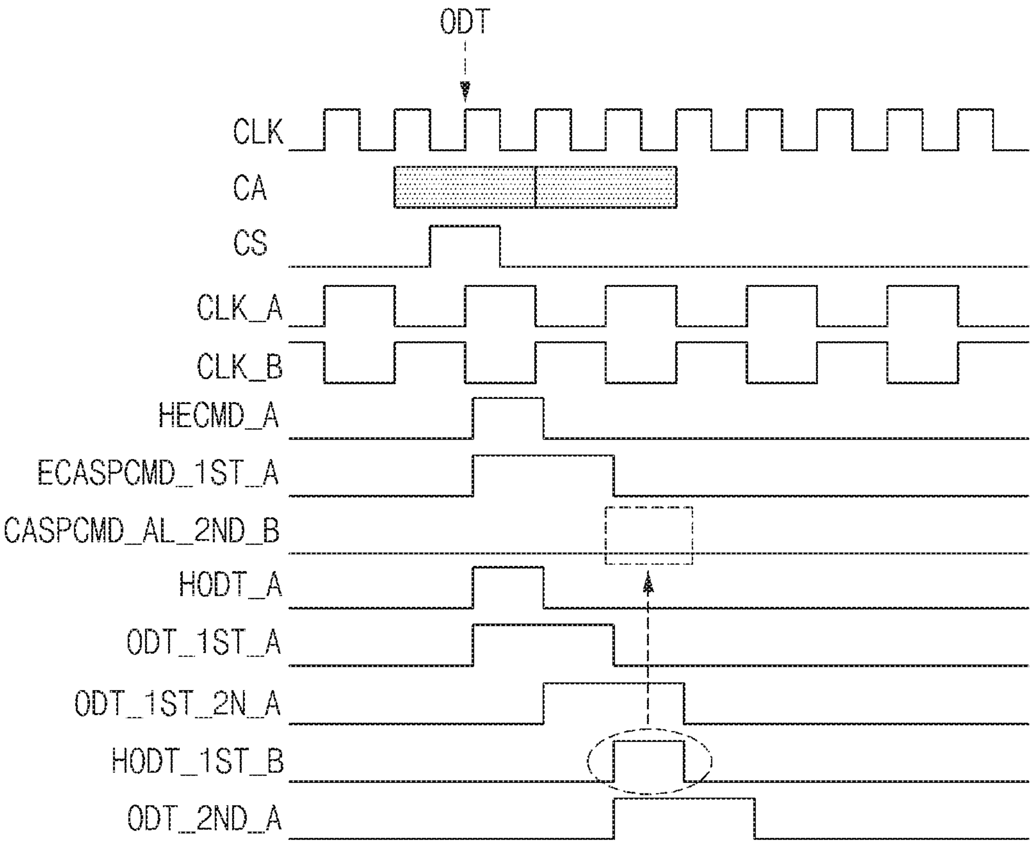
FIG. 9B is a timing diagram illustrating a part of signals of the first ODT command generation circuit and the first internal command generation circuit when the ODT command is inputted in the 2N mode.

FIG. 9B is a timing diagram illustrating a part of the signals of the first ODT command generation circuit 10a and the first internal command generation circuit 20a when the ODT command is inputted in the 2N mode.

Referring to FIG. 9B, the first control signal, that is, the command/address signal CA and the high-level chip select signal CS are inputted during two cycles of the external clock CLK. Then, the second control signal, that is, the command/address signal CA and the low-level chip select signal CS are inputted during the next two cycles of the external clock CLK. The command/address signal CA of the first control signal may have a different value from the command/address signal CA of the second control signal. In FIG. 9B, an arrow indicates an input timing of the ODT command.

The internal clock generation circuit 100 generates the first internal clock CLK_A and the second internal clock CLK_B, as in FIG. 9A. The first control signal receiver circuit 200a receives the first control signal, and generates the first internal control signal synchronized with the first internal clock CLK_A, that is, the first internal command/address signal ICA_A and the first internal chip select signal ICS_A.

FIG. 9B is based on the supposition that an input control signal including the first and second control signals corresponds to the ODT command, but a value obtained by decoding the first internal control signal corresponds to both of the first decoding signal HECMD_A and the first ODT decoding signal HODT_A, as in FIG. 8B. Therefore, the first ODT signal generation circuit 12a enables the first ODT decoding signal HODT_A. The first command/address decoder 300a enables the first decoding signal HECMD_A.

The pulse width adjusting circuit 13a generates the first pulse width adjusted ODT signal ODT_1ST_A by adjusting the pulse width of the first ODT decoding signal HODT_A to the cycle of the first internal clock CLK_A.

The D flip-flop 14a generates the first 2N mode ODT signal ODT_1ST_2N_A by synchronizing the first pulse width adjusted ODT signal ODT_1ST_A with the second internal clock CLK_B in the 2N mode, unlike in the normal mode.

Since the second internal chip select signal ICS_A is at a high level, the first ODT chip select signal control circuit 15b generates the first CS controlled ODT signal HODT_1ST_B from the first 2N mode ODT signal ODT_1ST_2N_A, the first CS controlled ODT signal HODT_1ST_B being enabled only during a period in which the first internal clock CLK_A is at a high level.

The pulse width adjusting circuit 16a generates the first ODT command ODT_2ND_A by adjusting the pulse width of the first CS controlled ODT signal HODT_1ST_B to the cycle of the first internal clock CLK_A.

The first chip select control circuit 400*a* generates the first intermediate signal ECASPCMD_1ST_A by adjusting the pulse width of the first decoding signal HECMD_A to the cycle of the first internal clock CLK_A.

The first delay control circuit 500*a* disables the first internal command ECASPCMD_2ND_B because the first CS controlled ODT signal HODT_1ST_B is enabled.

As a result, when the ODT command is inputted in the 2N mode, the internal command corresponding to the ODT command, that is, the first ODT command ODT_2ND_A may be outputted, and the internal command which is not the ODT command, that is, the first internal command ECASPCMD_2ND_B may not be outputted. At this time, in the 2N mode, the first CS controlled ODT signal HODT_1ST_B, not the second CS controlled ODT signal HODT_1ST_A, may correspond to the ODT command. Therefore, the first CS controlled ODT signal HODT_1ST_B is used in order to disable the first internal command ECASPCMD_AL_2ND_B.

According to a present embodiment, the semiconductor device can operate in the 2N mode as well as the normal mode.

Furthermore, since the semiconductor device includes the first internal command generation circuit operating based on the first internal clock and the second internal command generation circuit operated based on the second internal clock, the semiconductor device may not fix the input timing of the control signal to any one of the first and second internal clocks, but receive the control signal in synchronization with any one of the first and second internal clocks.

While certain embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow when taken in conjunction with the above description and accompanying drawings.

The configuration of active high or low level for indicating an active state of a signal or circuit may be changed depending on embodiments. Since the change of the circuit has a large number of cases and can be easily inferred by any one which is skilled in the art, the enumerations thereof are omitted herein.

What is claimed is:

1. A semiconductor device comprising:

an internal clock generation circuit configured to generate a first internal clock having a cycle corresponding to double a cycle of an external clock and a second internal clock having a substantially opposite phase to a phase of the first internal clock, based on the cycle of the external clock;

a control signal receiver circuit configured to sequentially receive first and second control signals and generate first and second internal control signals, based on the first and second internal clocks;

an on-die termination (ODT) command generation circuit configured to generate an ODT control signal based on results obtained by decoding the first and second internal control signals; and an internal command generation circuit configured to generate first and second internal commands based on the ODT control signal and the decoding results of the first and second internal control signals.

2. The semiconductor device of claim 1, wherein the control signal receiver circuit generates the first internal control signal corresponding to the first control signal and the second internal control signal corresponding to the second control signal in a normal mode, and generates the first internal control signal corresponding to the first control signal and the first internal control signal corresponding to the second control signal in a 2N mode.

3. The semiconductor device of claim 1, wherein the ODT command generation circuit comprises:

a first ODT signal generation circuit configured to generate a first ODT decoding signal by decoding the first internal control signal;

a second ODT signal generation circuit configured to generate a second ODT decoding signal by decoding the second internal control signal;

a first ODT chip select signal control circuit configured to generate a first chip select signal (CS) controlled ODT signal based on the first internal control signal and the second ODT decoding signal in a normal mode, and generate the first CS controlled ODT signal based on the first internal control signal and the first ODT decoding signal in a 2N mode; and a second ODT chip select signal control circuit configured to generate a second CS controlled ODT signal based on the second internal control signal and the first ODT decoding signal in the normal mode, and generate the second CS controlled ODT signal based on the second internal control signal and the second ODT decoding signal in the 2N mode.

4. The semiconductor device of claim 3, wherein the ODT control signal comprises one or more of the first ODT decoding signal, the second ODT decoding signal, the first CS controlled ODT signal and the second CS controlled ODT signal.

5. The semiconductor device of claim 1, wherein the internal command generation circuit comprises a first internal command generation circuit comprising:

a first command and address (command/address) decoder configured to generate a first decoding signal by decoding the first internal control signal;

a first chip select signal control circuit configured to generate a first intermediate signal based on the first decoding signal and any one of the first and second ODT decoding signals; and a first delay control circuit configured to generate the first internal command by adjusting a delay of the first intermediate signal.

6. The semiconductor device of claim 1, wherein the internal command generation circuit comprises a second internal command generation circuit comprising:

a second command/address decoder configured to generate a second decoding signal by decoding the second internal control signal;

a second chip select signal control circuit configured to generate a second intermediate signal based on the second decoding signal and the other one of the first and second ODT decoding signals; and a second delay control circuit configured to generate the second internal command by adjusting a delay of the second intermediate signal.

7. The semiconductor device of claim 3, wherein the internal command generation circuit comprises a first internal command generation circuit comprising:

a first command/address decoder configured to generate a first decoding signal by decoding the first internal control signal;

a first chip select signal control circuit configured to generate a first intermediate signal based on the first decoding signal and any one of the first and second ODT decoding signals; and a first delay control circuit configured to generate the first internal command by adjusting a delay of the first intermediate signal.

8. The semiconductor device of claim 3, wherein the internal command generation circuit comprises a second internal command generation circuit comprising:

a second command/address decoder configured to generate a second decoding signal by decoding the second internal control signal;

a second chip select signal control circuit configured to generate a second intermediate signal based on the second decoding signal and the other one of the first and second ODT decoding signals; and a second delay control circuit configured to generate the second internal command by adjusting a delay of the second intermediate signal.

9. The semiconductor device of claim 7, wherein the first chip select signal control circuit generates the first intermediate signal based on the first decoding signal and the second ODT decoding signal in the normal mode, and generates the first intermediate signal based on the first decoding signal and the first ODT decoding signal in the 2N mode.

10. The semiconductor device of claim 8, wherein the second chip select signal control circuit generates the second intermediate signal based on the second decoding signal and the first ODT decoding signal in the normal mode, and generates the second intermediate signal based on the second decoding signal and the second ODT decoding signal in the 2N mode.

11. The semiconductor device of claim 7, wherein the first delay control circuit comprises:

a first delay base signal generation circuit configured to generate a first delay base signal by delaying the first intermediate signal by a preset delay time;

a first delay signal generation circuit configured to generate a first delay intermediate signal based on the first delay base signal; and a first delay selection circuit configured to generate a first delay select signal by selecting any one of the first intermediate signal and the first delay signal based on the delay time.

12. The semiconductor device of claim 11, wherein the first delay base signal generation circuit generates the first delay base signal based on the first CS controlled ODT signal or the second CS controlled ODT signal.

13. The semiconductor device of claim 12, wherein the first delay base signal generation circuit generates the first delay base signal based on the second CS controlled ODT signal in the normal mode or the first CS controlled ODT signal in the 2N mode.

14. The semiconductor device of claim 8, wherein the second delay control circuit comprises:

a second delay base signal generation circuit configured to generate a second delay base signal by delaying the second intermediate signal by the delay time;

a second delay signal generation circuit configured to generate a second delay intermediate signal based on the second delay base signal; and a second delay selection circuit configured to generate a second delay select signal by selecting any one of the second intermediate signal and the second delay signal based on the delay time.

15. The semiconductor device of claim 14, wherein the second delay base signal generation circuit generates the second delay base signal based on the first CS controlled ODT signal or the second CS controlled ODT signal.

16. The semiconductor device of claim 15, wherein the second delay base signal generation circuit generates the second delay base signal based on the first CS controlled ODT signal in the normal mode or the second CS controlled ODT signal in the 2N mode.

17. The semiconductor device of claim 11, wherein the first delay selection circuit selects the first intermediate signal when the delay time is 0, or selects the first delay signal when the delay time is not 0.

18. The semiconductor device of claim 17, wherein when the delay time is 0, the first delay selection circuit selects the first intermediate signal based on the second CS controlled ODT signal in the normal mode or the first CS controlled ODT signal in the 2N mode.

19. The semiconductor device of claim 11, wherein the second delay selection circuit selects the second intermediate signal when the delay time is 0, or selects the second delay signal when the delay time is not 0.

* * * * *